US012750162B2

(12) United States Patent
Jakubov et al.

(10) Patent No.: US 12,750,162 B2
(45) Date of Patent: Sep. 29, 2026

(54) STATE REDUCTION FOR SEQUENCE ESTIMATION BASED ON SIGNAL QUALITY

(71) Applicant: QUALCOMM Incorporated, San Diego, CA (US)

(72) Inventors: Ondrej Jakubov, Bristol (GB); Paul Stephen Cooke, Swindon (GB)

(73) Assignee: QUALCOMM Incorporated, San Diego, CA (US)

( * ) Notice: Subject to any disclaimer, the term of this patent is extended or adjusted under 35 U.S.C. 154(b) by 51 days.

(21) Appl. No.: 18/982,935

(22) Filed: Dec. 16, 2024

(65) Prior Publication Data

US 2026/0172144 A1 Jun. 18, 2026

(51) Int. Cl.

| | |
|---|---|
| ***H04L 1/00*** | (2006.01) |
| ***H03M 13/25*** | (2006.01) |
| ***H03M 13/41*** | (2006.01) |
| ***H04L 1/20*** | (2006.01) |

(52) U.S. Cl.

CPC ........ *H04L 1/0054* (2013.01); *H03M 13/256* (2013.01); *H03M 13/41* (2013.01); *H04L 1/20* (2013.01)

(58) Field of Classification Search

CPC ...... H04L 1/0054; H04L 1/20; H03M 13/256; H03M 13/41

USPC .......................................................... 714/726

See application file for complete search history.

(56) References Cited

U.S. PATENT DOCUMENTS

| | | | | |
|---|---|---|---|---|
| 6,744,814 B1 | | 6/2004 | Blanksby et al. | |
| 11,082,270 B1 | * | 8/2021 | Wu | H04W 52/0245 |
| 2003/0101408 A1 | * | 5/2003 | Martinian | H04L 1/0071 714/776 |
| 2009/0296798 A1 | * | 12/2009 | Banna | H04B 1/7097 370/328 |

FOREIGN PATENT DOCUMENTS

| | | | | |
|---|---|---|---|---|
| DE | 112014004666 T5 * | 6/2016 | | H04B 3/04 |
| EP | 0872095 B1 | 8/2005 | | |

OTHER PUBLICATIONS

International Search Report and Written Opinion—PCT/US2025/055381—ISA/EPO—Feb. 9, 2026.

Mohammad M., et al., "A Comparison Between the M-algorithm and the List Viterbi Algorithm", Military Communications Conference, 2008. MILCOM 2008. IEEE, IEEE, Piscataway, NJ, USA, Nov. 16, 2008, pp. 1-5, XP031408054, The Whole Document.

Souza R D., et al., "Reduced Complexity Decoding of Convolutional Codes Based on the M-algorithm and the Minimal Trellis", Annals of Telecommunications—Annales Des Ta La Communications, Springer-verlag, Paris, vol. 67, No. 11-12, Mar. 13, 2012, pp. 537-545, XP035143596, The Whole Document.

* cited by examiner

*Primary Examiner* — Albert Decady
*Assistant Examiner* — Enam Ahmed
(74) *Attorney, Agent, or Firm* — Harrity & Harrity, LLP

(57) ABSTRACT

Various aspects of the present disclosure generally relate to wireless communication. In some aspects, a wireless receiver may receive a sequence of bits. The wireless receiver may determine a signal quality for a packet of the sequence of bits. The wireless receiver may apply a reduced state low power mode based at least in part on the signal quality being outside of a signal quality margin. Numerous other aspects are described.

15 Claims, 26 Drawing Sheets

400

600

1500

1800

| $\delta_{n=3}$ | $\mathcal{P}_{n=3}(\delta)$ | |
|---|---|---|
| 0 | 1.85 | Discard |
| 2 | 0.05 | Survive |
| 4 | 0.65 | Survive |
| 6 | 0.21 | Survive |
| 8 | 0.42 | Survive |
| 10 | 0.95 | Discard |
| 12 | 1.23 | Discard |
| 14 | 1.17 | Discard |

⇒

| State Position $i$ | State Index $\delta_{n=3}$ | Path Metric $\mathcal{P}_{n=3}(\delta)$ |
|---|---|---|
| 0 | 2 | 0.05 |
| 1 | 4 | 0.65 |
| 2 | 6 | 0.21 |
| 3 | 8 | 0.42 |

FIG. 18

2400

Trace-back memory – previous state positions

| State Position $i$ | Symbol Time $n$ (Right) | 0 | 1 | 2 | 3 | 4 | 5 |
|---|---|---|---|---|---|---|---|
| 0 | | | 0 | 0 | 1 | 0 | 0 |
| 1 | | | 0 | 1 | 2 | 2 | 0 |
| 2 | | | | 0 | 3 | 2 | 1 |
| 3 | | | | 1 | 0 | 3 | 2 |

Winning state is at position 1 with path metric 0.10

3002

The linked list of previous state positions brings us back to the start of the traceback Trace-back memory – state index (binary)

| State Position $i$ | Symbol Time $n$ | 0 | 1 | 2 | 3 | 4 | 5 |
|---|---|---|---|---|---|---|---|
| 0 | | 0000 | 0000 | 0000 | 0010 | 0001 | 0000 |
| 1 | | | 1000 | 0100 | 0100 | 0011 | 1000 |
| 2 | | | | 1000 | 0110 | 1011 | 1001 |
| 3 | | | | 1100 | 1000 | 1100 | 1101 |

The same linking is applied to the branch decisions which alongside the winning trellis state index determines the bit decisions The bold bits (LSB of the state index) are branch decisions that need to be stored, since they are discarded in the next step due to shifting The underlined bits (MSB of the state index) are the decoded bits: 10001

FIG. 24

STATE REDUCTION FOR SEQUENCE ESTIMATION BASED ON SIGNAL QUALITY

FIELD OF THE DISCLOSURE

Aspects of the present disclosure generally relate to wireless communication and specifically relate to techniques, apparatuses, and methods associated with state reduction for sequence estimation based on signal quality.

BACKGROUND

Wireless communication systems are widely deployed to provide various types of communication content such as voice, video, packet data, messaging, broadcast, and so on. These systems may be multiple-access systems capable of supporting communication with multiple users by sharing the available system resources (for example, time, frequency, and power). A wireless network, for example a wireless local area network (WLAN), such as a Wi-Fi (for example, Institute of Electrical and Electronics Engineers (IEEE) 802.11) network, may include an access point (AP) that may communicate with one or more stations (STAs) or mobile devices. The AP may be coupled to a network, such as the Internet, and may enable a mobile device to communicate via the network (or communicate with other devices coupled to the access point). A wireless device may communicate with a network device bi-directionally. For example, in a WLAN, a STA may communicate with an associated AP via downlink and uplink. "Downlink" may refer to the communication link from the AP to the station, and "uplink" may refer to the communication link from the station to the AP.

The AP may be coupled to a network, such as the Internet, and may enable a mobile device to communicate via the network (or communicate with other devices coupled to the access point). A wireless device may communicate with a network device bi-directionally. For example, in a WLAN, a device may communicate with an associated AP via downlink (for example, the communication link from the AP to the device) and uplink (for example, the communication link from the device to the AP). A wireless personal area network (WPAN), which may include a Bluetooth® connection, may provide for short range wireless connections between two or more paired wireless devices. For example, wireless devices such as cellular phones may utilize WPAN communications to exchange information such as audio signals with wireless headsets.

The wireless device may communicate using a short-range wireless protocol, such as a Bluetooth® protocol, and may connect and exchange information between devices and paired devices (for example, between mobile phones, computers, digital cameras, wireless headsets, speakers, keyboards, mice or other input peripherals, and similar devices).

SUMMARY

Some aspects described herein relate to a method of wireless communication performed by a wireless receiver. The method may include receiving a sequence of bits. The method may include determining a signal quality for a packet of the sequence of bits. The method may include applying a reduced state low power mode based at least in part on the signal quality being outside of a signal quality margin.

Some aspects described herein relate to an apparatus for wireless communication at a wireless receiver. The apparatus may include one or more memories and one or more processors coupled to the one or more memories. The one or more processors may be individually or collectively configured to receive a sequence of bits. The one or more processors may be individually or collectively configured to determine a signal quality for a packet of the sequence of bits. The one or more processors may be individually or collectively configured to apply a reduced state low power mode based at least in part on the signal quality being outside of a signal quality margin.

Some aspects described herein relate to a non-transitory computer-readable medium that stores a set of instructions for wireless communication by a wireless receiver. The set of instructions, when executed by one or more processors of the wireless receiver, may cause the wireless receiver to receive a sequence of bits. The set of instructions, when executed by one or more processors of the wireless receiver, may cause the wireless receiver to determine a signal quality for a packet of the sequence of bits. The set of instructions, when executed by one or more processors of the wireless receiver, may cause the wireless receiver to apply a reduced state low power mode based at least in part on the signal quality being outside of a signal quality margin.

Some aspects described herein relate to an apparatus for wireless communication. The apparatus may include means for receiving a sequence of bits. The apparatus may include means for determining a signal quality for a packet of the sequence of bits. The apparatus may include means for applying a reduced state low power mode based at least in part on the signal quality being outside of a signal quality margin.

Aspects of the present disclosure may generally be implemented by or as a method, apparatus, system, computer program product, non-transitory computer-readable medium, user equipment, mobile station, base station, network node, access point, network entity, wireless communication device, and/or processing system as substantially described with reference to, and as illustrated by, this specification and accompanying drawings.

The foregoing paragraphs of this section have broadly summarized some aspects of the present disclosure. These and additional aspects and associated advantages will be described hereinafter. The disclosed aspects may be used as a basis for modifying or designing other aspects for carrying out the same or similar purposes of the present disclosure. Such equivalent aspects do not depart from the scope of the appended claims. Characteristics of the aspects disclosed herein, both their organization and method of operation, together with associated advantages, will be better understood from the following description when considered in connection with the accompanying drawings.

BRIEF DESCRIPTION OF THE DRAWINGS

The appended drawings illustrate some aspects of the present disclosure but are not limiting of the scope of the present disclosure because the description may enable other aspects. Each of the drawings is provided for purposes of illustration and description, and not as a definition of the limits of the claims. The same or similar reference numbers in different drawings may identify the same or similar elements.

FIG. 18 is a diagram illustrating an example of a system model of mapping transmit bits into two consecutive transmitted IQ symbols for an HDT 7.5 Mbps data rate that includes puncturing, in accordance with the present disclosure.

FIG. 24 is a diagram illustrating an example of a trace back using a link list of previous state positions and branch decisions stemming from the current winning state index showing decoded bits, in accordance with the present disclosure.

DETAILED DESCRIPTION

Figure 1:
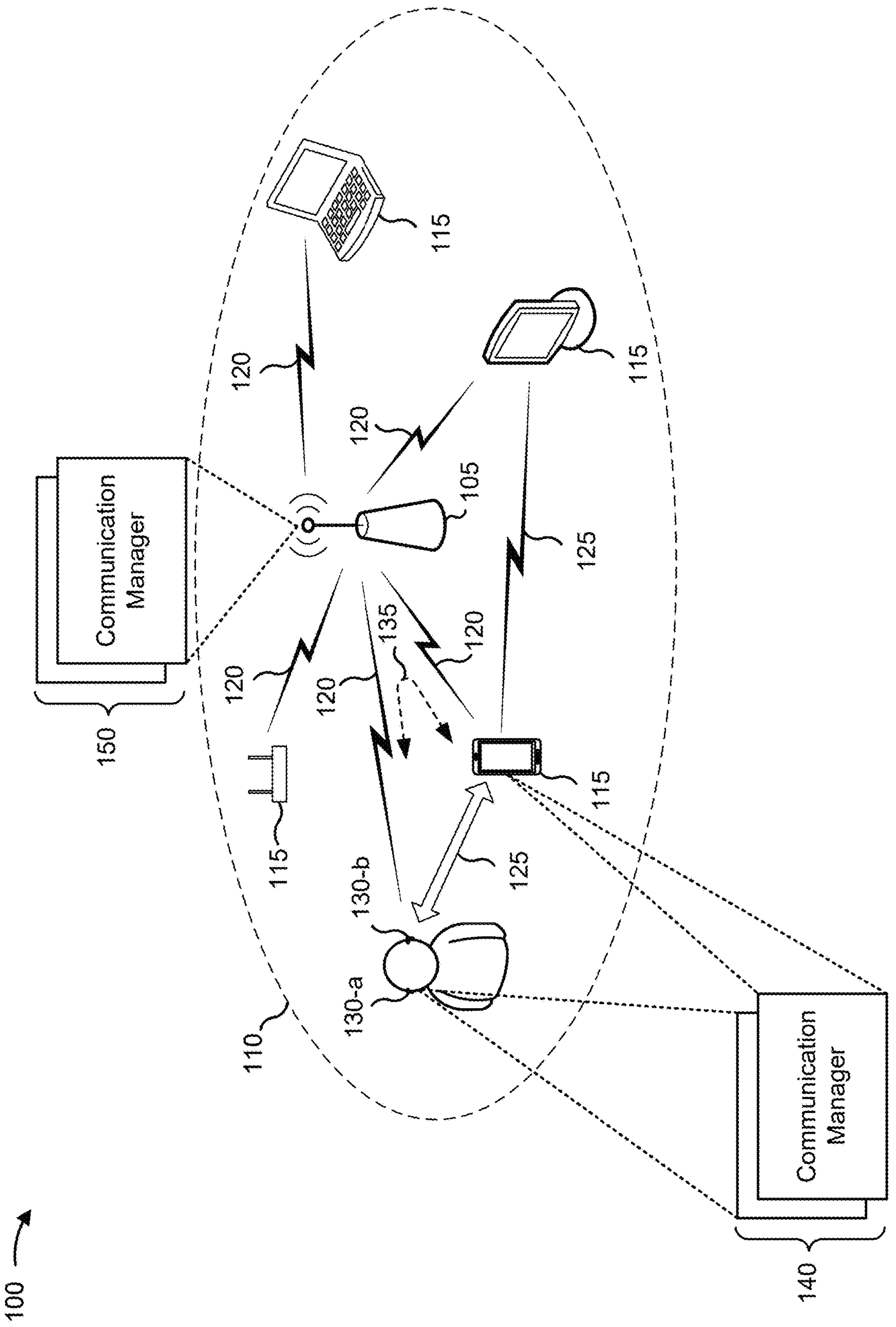
FIG. 1 shows a wireless communication network, in accordance with the present disclosure.

Various aspects of the present disclosure are described hereinafter with reference to the accompanying drawings. However, aspects of the present disclosure may be embodied in many different forms. The present disclosure is not to be construed as limited to any specific aspect illustrated by or described with reference to an accompanying drawing or otherwise presented in this disclosure. Rather, these aspects are provided so that this disclosure will be thorough and complete, and will fully convey the scope of the disclosure to those skilled in the art. One skilled in the art may appreciate that the scope of the disclosure is intended to cover any aspect of the disclosure disclosed herein, whether implemented independently of or in combination with any other aspect of the disclosure. For example, an apparatus may be implemented or a method may be practiced using various combinations or quantities of the aspects set forth herein. In addition, the scope of the disclosure is intended to cover an apparatus having, or a method that is practiced using, other structures and/or functionalities in addition to or other than the structures and/or functionalities with which various aspects of the disclosure set forth herein may be practiced. Any aspect of the disclosure disclosed herein may be embodied by one or more elements of a claim.

Several aspects of telecommunication systems will now be presented with reference to various methods, operations, apparatuses, and techniques. These methods, operations, apparatuses, and techniques will be described in the following detailed description and illustrated in the accompanying drawings by various blocks, modules, components, circuits, steps, processes, or algorithms (collectively referred to as "elements"). These elements may be implemented using hardware, software, or a combination of hardware and software. Whether such elements are implemented as hardware or software depends upon the particular application and design constraints imposed on the overall system.

In some aspects, a wireless receiver may receive a sequence of bits and use a Viterbi decoder to determine the sequence that was transmitted. The Viterbi decoder uses a Viterbi algorithm that forms a trellis to systematically track the most likely sequence of states over time. Each stage in the trellis represents a time step or symbol with a number of possible states at state positions of the time step. A path through the trellis represents a possible sequence of states, at one state position for each time step. As the received sequence is processed, the Viterbi algorithm calculates a branch metric (e.g., Hamming distance or Euclidean distance) for each path in the trellis. This branch metric measures how closely the path matches the received sequence. At each stage, the Viterbi decoder keeps track of the survivor paths, which are the most likely paths through the trellis that lead to each state. After processing the entire received sequence, the Viterbi decoder traces back from the final state to determine the most likely sequence of states and, consequently, the most likely transmitted data sequence.

In most scenarios, a packet for the sequence of bits is received during good signal conditions, such that the sequence of bits can sustain a given application. However, due to channel fading, signal conditions vary from packet to packet. To sustain the application, the majority of the packets are to be received at better than minimum required signal conditions, or outside of a margin that extends from error conditions (e.g., signal quality below a signal quality threshold) into good conditions (e.g., signal quality above the signal quality threshold). The Viterbi decoder may reduce the states in the trellis or the length of a trace back through the trellis to reduce the complexity of the sequence estimation. Reducing the complexity reduces the processing resources and the power consumed. The reduced state trace back operates as a low power mode. However, when the low power mode is applied to all packets, the wireless receiver's nominal sensitivity is reduced. That is, the low power mode is not appropriate in all scenarios or signal conditions. If the low power mode is applied during poorer signal conditions, the sequence estimation errors increase, which reduces throughput.

Various aspects relate generally to decoding sequences. Some aspects more specifically relate to a wireless receiver that may selectively apply the low power mode to those packets with a sufficient margin of signal quality, where the estimated signal quality for the given packet is sufficient. For example, the wireless receiver may receive a sequence of bits and determine a signal quality for a packet of the sequence of bits. The wireless receiver may apply the reduced state low power mode based at least in part on the signal quality being outside of (e.g., above a top edge of) a signal quality margin (e.g., a signal condition quality space or range above a good condition minimum of signal quality).

Particular aspects of the subject matter described in this disclosure can be implemented to realize one or more of the following potential advantages. By applying the reduced state low power mode based at least in part on the signal quality being outside of the signal quality margin, there is no performance loss of the sequence estimation and throughput does not decrease.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Some or all of the described examples may be implemented in any device, system or network that is capable of transmitting and receiving radio frequency (RF) signals according to one or more of the Institute of Electrical and Electronics Engineers (IEEE) 802.11 standards, the IEEE 802.15 standards, the Bluetooth® standards as defined by the Bluetooth Special Interest Group (SIG), or the Long Term Evolution (LTE), 3G, 4G, 5G (New Radio (NR)) or 6G standards promulgated by the 3rd Generation Partnership Project (3GPP), among others. One skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

FIG. 1 shows a wireless communication network 100, in accordance with the present disclosure. The wireless communication network 100 may be a wireless local area network (WLAN) or a Wi-Fi network. For example, the wireless communication network 100 can be a network implementing at least one of the IEEE 802.11 family of wireless communication protocol standards (such as defined by the IEEE 802.11-2020 specification or amendments thereof including, but not limited to, 802.11ay, 802.11ax, 802.11az, 802.11ba, 802.11bc, 802.11bd, 802.11be, 802.11bf, and 802.11bn). In some other examples, the wireless communication network 100 can be an example of a cellular radio access network (RAN), such as a 5G or 6G RAN that implements one or more cellular protocols such as those specified in one or more 3GPP standards. In some examples, the wireless communication network 100 can include a WLAN that functions in an interoperable or converged manner with one or more personal area networks, such as a network implementing Bluetooth or other wireless technologies, to provide greater or enhanced network coverage or to provide or enable other capabilities, functionality, applications or services.

The wireless communication network 100 may include a central device 105 (e.g., AP, Bluetooth network entity) and multiple associated devices 115 (such as stations (STAs) or SAPs). The devices 115 may include mobile stations, user equipments (UEs), personal digital assistants (PDAs), other handheld devices, netbooks, notebook computers, tablet computers, laptops, Chromebooks, augmented reality (AR), virtual reality (VR), mixed reality (MR) or extended reality (XR) wireless headsets or other peripheral devices, wireless earbuds, other wearable devices, display devices (for example, TVs, computer monitors, or video gaming consoles), video game controllers, navigation systems, music or other audio or stereo devices, remote control devices, printers, kitchen appliances (including smart refrigerators) or other household appliances, key fobs (for example, for passive keyless entry and start (PKES) systems), Internet of Things (IoT) devices, and/or vehicles, among other examples.

The central device 105 and the associated devices 115 (for example, associated STAs) may represent a basic service set (BSS) or an extended service set (ESS). A BSS includes devices that communicate with each other, and an ESS may include multiple BSSs or one or more BSSs and associated wired networks. The various devices 115 in the network are able to communicate with one another through the central device 105. The central device 105 may support a coverage area 110, which may represent a basic service area (BSA) of the wireless communication network 100. An extended network station (not shown) associated with the wireless communication network 100 may be connected to a wired or wireless distribution system that may allow multiple central devices 105 to be connected in an ESS.

While only one central device 105 is shown in FIG. 1, the wireless communication network 100 can include multiple central devices 105. The central device 105 can be or represent various different types of network entities including, but not limited to, a home networking AP, an enterprise-level AP, a single-frequency AP, a dual-band simultaneous (DBS) AP, a tri-band simultaneous (TBS) AP, a standalone AP, a non-standalone AP, a software-enabled AP (soft AP), and a multi-link AP (also referred to as an AP multi-link device (MLD)), as well as cellular (such as 3GPP, 4G LTE, 5G or 6G) base stations or other cellular network nodes such as a Node B, an evolved Node B (eNB), a gNB, a transmission reception point (TRP) or another type of device or equipment included in a radio access network (RAN), including Open-RAN (O-RAN) network entities, such as a central unit (CU), a distributed unit (DU) or a radio unit (RU).

Although not shown in FIG. 1, a device 115 may be located in the intersection of more than one coverage area 110 and may associated with more than one central device 105. A single AP and an associated set of devices 115 may be referred to as a BSS. A distribution system (not shown) may be used to connect APs in an ESS. In some cases, the coverage area 110 of an AP may be divided into sectors (also not shown). The wireless communication network 100 may include APs of different types (for example, a metropolitan area, or a home network) with varying and/or overlapping coverage areas 110. Two devices 115 may also communicate directly via a direct wireless communication link 125 regardless of whether both devices 115 are in the same coverage area 110. Examples of direct wireless communication links 120 may include Wi-Fi Direct connections, Wi-Fi Tunneled Direct Link Setup (TDLS) links, and other group connections. Devices 115 and APs may communicate according to the WLAN radio and baseband protocol for physical and medium access control (MAC) layers from IEEE 802.11 and versions including 802.11b, 802.11g, 802.11a, 802.11n, 802.11ac, 802.11ad, 802.11ah, and/or 802.11ax, among other examples. In other implementations, peer-to-peer connections or ad hoc networks may be implemented within wireless communication network 100.

In some cases, a device 115 (or an AP) may be detectable by a central AP, but not by other devices 115 in the coverage area 110 of the central AP. For example, one device 115 may be at one end of the coverage area 110 of the central AP while another device 115 may be at the other end. Thus, both devices 115 may communicate with the AP, but may not receive the transmissions of the other. This may result in colliding transmissions for the two devices 115 in a contention-based environment (for example, carrier sense multiple access with collision avoidance (CSMA/CA)) because the devices 115 may not refrain from transmitting on top of each other. A device 115 whose transmissions are not identifiable, but that is within the same coverage area 110 may be known as a hidden node. CSMA/CA may be supplemented by the exchange of a request-to-send (RTS) packet transmitted by a sending device 115 (or AP) and a clear-to-send (CTS) packet transmitted by the receiving device 115 (or AP). This may alert other devices within range of the sender and receiver not to transmit for the duration of the primary transmission. Thus, RTS and/or CTS may help mitigate a hidden node problem.

The wireless communication network 100 may include a central device 105, devices 115 (for example, which may be referred to as source devices or central devices), and paired devices 115 (for example, which may be referred to as sink devices or peripheral devices) implementing WLAN communications (for example, Wi-Fi communications) and/or Bluetooth communications. For example, devices 115 may include cell phones, UEs, STAs, mobile stations, PDAs, other handheld devices, netbooks, notebook computers, tablet computers, laptops, or some other suitable devices. Paired devices 115 may include Bluetooth-enabled devices capable of pairing with other Bluetooth-enabled devices (for example, such as devices 115), which may include wireless audio devices (for example, headsets, earbuds, speakers, earpieces, headphones), display devices (for example, televisions or computer monitors), microphones, meters, and/or valves, among other examples. As one example, the paired devices 115 may include a wireless audio device 130-*a* and a wireless audio device 130-*b* as shown by FIG. 1 (for example, wireless earbuds), and the paired devices 115 may alternatively or additionally communicate with the central device 105. In some aspects, a paired device 115 may communicate with a device 115 using the central device 105.

"Bluetooth communications" may refer to a short-range communication protocol and may be used to connect and exchange information between devices 115 and paired devices 115 (for example, between mobile phones, computers, digital cameras, wireless headsets, speakers, keyboards, mice or other input peripherals, and similar devices). Bluetooth systems (for example, aspects of wireless communication network 100) may be organized using a central-peripheral relationship employing a time-division duplex protocol having, for example, defined time slots of 625 microseconds, in which transmission alternates between the central device (for example, a device 115) and one or more peripheral devices (for example, paired devices 115). In some examples, "device" 115 may generally refer to a central device, and "paired device" 115 may refer to a peripheral device in the wireless communication network 100. Therefore, in some examples, a device may be referred to as either a device 115 or a paired device 115 based on the Bluetooth role configuration of the device. That is, designation of a device as either a device 115 or a paired device 115 may not necessarily indicate a distinction in device capability, but rather may refer to or indicate roles held by the device in the wireless communication network 100. Generally, "device" 115 may refer to a wireless communication device capable of wirelessly exchanging data signals with another device (for example, a paired device 115), and "paired device" 115 may refer to a device operating in a peripheral role, or to a short-range wireless communication device capable of exchanging data signals with the device 115 (for example, using Bluetooth communication protocols).

A communication link 125 may be established between two Bluetooth-enabled devices (for example, between a device 115 and a paired device 115) and may provide for communications or services (for example, according to some Bluetooth profiles). The communication link may use, for example, a Bluetooth LE audio protocol for transferring audio (point-to-point or by broadcast). The controller stack may be responsible for setting up communication links 125, such as asynchronous connection-oriented links (or asynchronous connection-oriented connections), synchronous connection-orientated (SCO) links (or SCO connections), extended synchronous connection-oriented (eSCO) links (or eSCO connections), and/or other logical transport channel links. For example, a Bluetooth connection may be an eSCO connection for voice calls (for example, which may allow for retransmission), and/or an asynchronous connection-less (ACL) connection for music streaming (for example, advanced audio distribution profile (A2DP)), among other examples. eSCO packets may be transmitted in predetermined time slots (for example, 6 Bluetooth slots each for eSCO). The regular interval between the eSCO packets may be specified when the Bluetooth link is established. The eSCO packets to/from a specific device (for example, paired device 115) are acknowledged and may be retransmitted if not acknowledged during a retransmission window. In addition, audio may be streamed between a device 115 and a paired device 115 using an ACL connection (for example, an A2DP profile). In some cases, the ACL connection may occupy 1, 3, or 5 Bluetooth slots for data or voice. Other Bluetooth profiles supported by Bluetooth-enabled devices may include Bluetooth Low Energy (BLE) (for example, providing considerably reduced power consumption and cost while maintaining a similar communication range), human interface device (HID) profile (for example, providing low latency links with low power requirements), etc.

A device 115 may, in some examples, be capable of both Bluetooth and WLAN communications. For example, WLAN and Bluetooth components may be co-located within a device, such that the device may be capable of communicating according to both Bluetooth and WLAN communication protocols, as each technology may offer different benefits or may improve user experience in different conditions. In some examples, Bluetooth and WLAN communications may share a same medium, such as the same unlicensed frequency medium. In such examples, a device 115 may support WLAN communications via an AP (for example, over communication links 120). The AP and the associated devices 115 may represent a BSS or an ESS. The various devices 115 in the network may be able to communicate with one another through the AP. In some cases the AP may be associated with a coverage area, which may represent a BSA.

Devices 115 and APs may communicate according to the WLAN radio and baseband protocol for physical and MAC layers from IEEE 802.11 and versions including, but not limited to, 802.11b, 802.11g, 802.11a, 802.11n, 802.11ac, 802.11ad, 802.11ah, and/or 802.11ax. In other examples, peer-to-peer connections or ad hoc networks may be implemented within wireless communication network 100, and devices may communicate with each other via communication links 120 (for example, Wi-Fi Direct connections, Wi-Fi TDLS links, peer-to-peer communication links, or other peer or group connections). An AP may be coupled to a network (such as the Internet) and may enable a device 115 to communicate via the network (or communicate with other devices 115 coupled to the AP). A device 115 may communicate with a network device bi-directionally. For example, in a WLAN, a device 115 may communicate with an associated central device 105 via downlink (for example, the communication link from the central device 105 to the device 115) and uplink (for example, the communication link from the device 115 to the central device 105).

In some examples, content, media, and/or audio, among other examples, exchanged between a device 115 and a paired device 115 may originate from a WLAN. In some examples, device 115 may receive audio from a central device 105 (for example, via WLAN communications), and the device 115 may then relay or pass the audio to the paired device 115 (for example, via Bluetooth communications and/or the central device 105). As one example, the device 115 may relay or pass the audio to the paired device 115 via the direct wireless communication link 125. Alternatively, or additionally, the device 115 may relay and/or pass the audio to the paired device via the central device 105 as shown by reference number 135. In some examples, certain types of Bluetooth communications (for example, such as high quality or high definition (HD) Bluetooth) may require enhanced quality of service. For example, in some examples, delay-sensitive Bluetooth traffic may have a higher priority than WLAN traffic.

In some examples, a wireless communication device (for example, the central device 105 and/or a device 115) may support applications associated with low-latency or lossless audio to one or more other devices, such as one or more personal audio devices. For example, a wireless communication device may support applications and use cases associated with ultra-low latency (ULL), such as ULL gaming, or streaming lossless audio to one or more personal audio devices (for example, peripheral devices) of a user or one or more headset devices (for example, AR/VR/MR/XR headset devices). In scenarios in which a user uses two or more peripheral devices (for example, a wireless audio device 130-*a* and a wireless audio device 130-*b*), the wireless communication device may support an expanded personal area network (XPAN) enabling communication with the two or more peripheral devices.

To meet latency or lossless criteria associated with an application or use case, XPAN devices may employ a target wake time (TWT) technique for communication between the wireless communication device and the peripheral devices. Initial or default TWT parameters may be set under an expectation for ideal (for example, interference-free or approximately interference-free) conditions and may be updated in response to changing channel conditions or a changing concurrency situation at the wireless communication device. In some systems, the peripheral devices and the wireless communication device may exchange one or more Bluetooth messages and implement a complete TWT teardown between the wireless communication device and each of the peripheral devices. Such an exchange of Bluetooth messages and TWT teardown may introduce too much latency for some applications, such as ULL gaming or streaming lossless audio applications.

In some examples, a wireless communication device, which may be a device 115 (for example, a handset) or a central device 105, and a set of peripheral devices may use downlink audio data packets to carry updated TWT parameters or any other XPAN-related parameters that the wireless communication device and the peripheral devices may indicate via wireless signaling. In some examples, the wireless communication device may embed a set of updated parameters (for example, updated TWT parameters or other parameters associated with the XPAN) in one or more fields, such as one or more contributing source (CSRC) fields, of a real-time transport protocol (RTP) audio header of an audio data packet and may transmit the audio data packet to the peripheral devices. Additionally, or alternatively, the wireless communication device may embed a set of updated parameters in a padding section of an audio data packet and may transmit the audio data packet to the peripheral devices. The peripheral devices may each acknowledge the audio data packet transmitted by the wireless communication device and the wireless communication device may communicate in accordance with the updated parameters based on receiving acknowledgements from each of the peripheral devices.

In accordance with the example implementations described herein, various devices may use over-the-air transmissions to indicate updated parameters (for example, updated XPAN-related parameters, such as updated TWT parameters) via one or both of RTP audio header CSRC fields or padding fields in a payload data section. Consequently, the various devices may use a sequence of over-the-air packet transmissions to change or update a set of parameters (for example, a set of TWT parameters). For example, via audio data packet transmissions, the various devices may configure, trigger, or indicate an increase or a decrease in audio packet periodicity (for example, when TWT service interval (SI) is changed). Further, in accordance with the described techniques, such devices may avoid an explicit TWT teardown, request, and response frame exchange and may instead achieve a TWT sequence change after RTP audio header CSRC fields or a padding section indicates updated TWT parameters.

In some aspects, a wireless receiver (e.g., central device 105, device 115) may include a communication manager 140 or 150. As described in more detail elsewhere herein, the communication manager 140 or 150 may receive a sequence of bits; determine a signal quality for a packet of the sequence of bits; and apply a reduced state low power mode based at least in part on the signal quality being outside of a signal quality margin. Additionally, or alternatively, the communication manager 140 or 150 may perform one or more other operations described herein.

Figure 2:
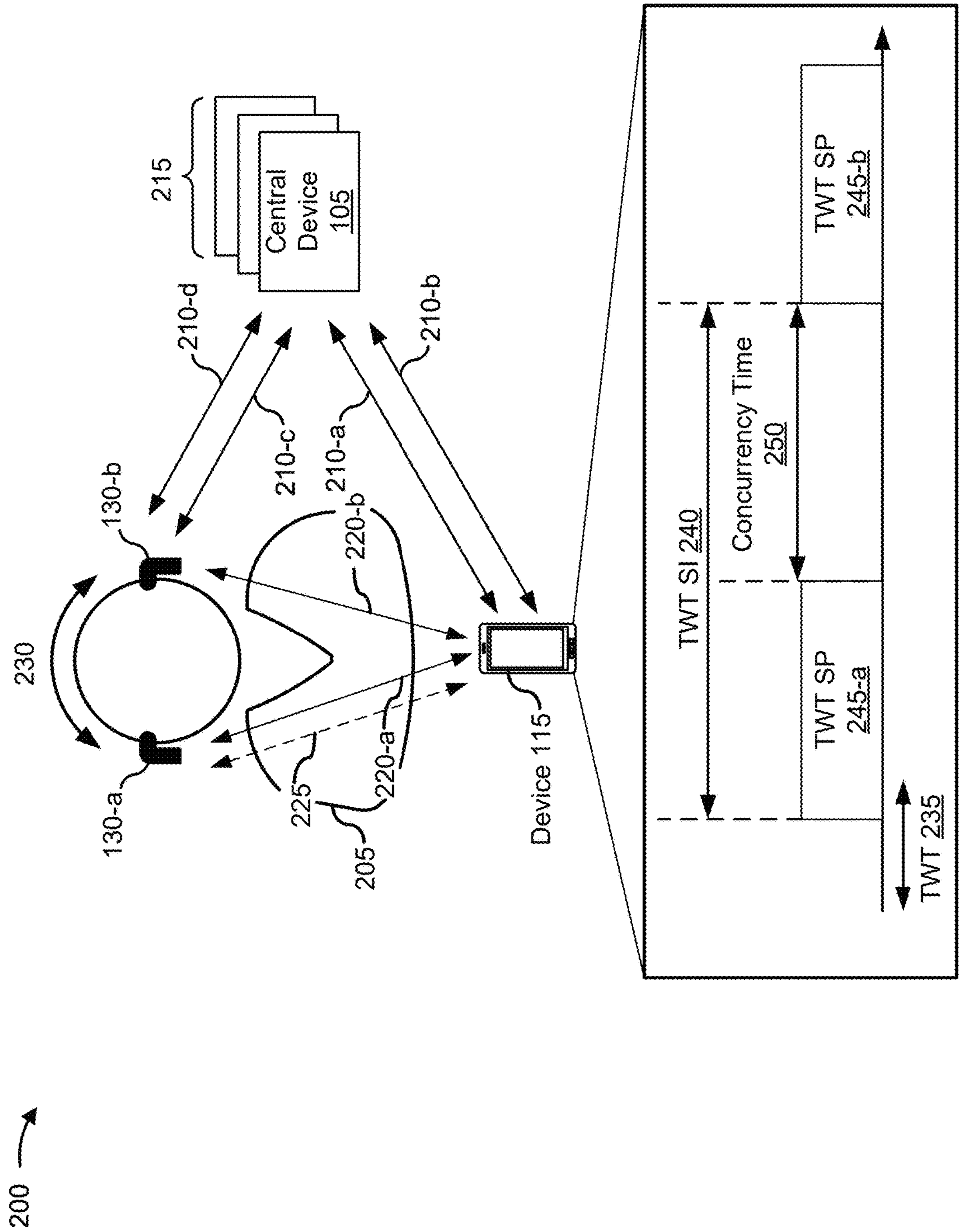
FIG. 2 illustrates an example of a wireless communication network that supports low-latency parameter updates for extended personal audio networks in accordance with the present disclosure.

FIG. 2 illustrates an example of a wireless communication network 200 that supports low-latency parameter updates for extended personal audio networks in accordance with the present disclosure. The wireless communication network 200 may implement or be implemented to realize aspects of the wireless communication network 100. For example, the wireless communication network 200 illustrates communication between a central device 105, a device 115 (for example, a handset or handheld device), and a wireless audio device 130-*a* and a wireless audio device 130-*b* of a user 205 (for example, examples of audio devices and/or peripheral devices), which may be examples of corresponding devices as illustrated by and described with reference to FIG. 1. In some examples, the device 115, the wireless audio device 130-*a*, and the wireless audio device 130-*b* may support a signaling-based mechanism according to which the device 115 may transmit an indication of a set of updated parameters to each of the wireless audio device 130-*a* and the wireless audio device 130-*b* via one or audio data packets.

In some examples, the device 115 may communicate with the central device 105 via one or both of a link 210-*a* and a link 210-*b*, which may be examples of infrastructure links between the central device 105 and the device 115. Alternatively, or additionally, the central device 105 may communicate with the wireless audio device 130-*a* and/or the wireless audio device 130-*b* via one or both of a link 210-*c* and a link 210-*d*, respectively. In some examples, the wireless audio device 130-*a* and the wireless audio device 130-*b* may be connected to a same central device 105 as the device 115. In other aspects, the wireless audio device 130-*a* and the wireless audio device 130-*b* may be connected to a different central device 105 than the device 115. Accordingly, and as shown by reference number 215, the device 115, the wireless audio device 130-*a*, and/or the wireless audio device 130-*b* may communicate with one another via multiple central devices 105. The link 210-*a* may be an example of a 2.4 GHz link between the central device 105 and the device 115, and the link 210-*b* may be an example of a 5 GHz link or a 6 GHz link between the central device 105 and the device 115. In some examples, the link 210-*c* and/or the link 210-*d* may be a 2.4 GHz link, a 5 GHz, and/or a 6 GHz link.

The device 115 may communicate wirelessly with each of the wireless audio device 130-*a* and the wireless audio device 130-*b*, where each of the wireless audio device 130-*a* and the wireless audio device 130-*b* may be associated with an XPAN of the device 115. For example, the device 115 may communicate with the wireless audio device 130-*a* via a link 220-*a* and may communicate with the wireless audio device 130-*b* via a link 220-*b*, where the link 220-*a* and the link 220-*b* may be referred to or understood as XPAN links. The link 220-*a* may be an example of a 5 GHz link or a 6 GHz link and the link 220-*b* may be an example of a 5 GHz link or a 6 GHz link. Additionally, in some examples, the device 115 may communicate with the wireless audio device 130-*a*, which may be an example of a primary earbud, via a communication link 225. The communication link 225 may be an example of a Bluetooth link between the device 115 and the wireless audio device 130-*a*. The wireless audio device 130-*a* and the wireless audio device 130-*b*, which may be an example of a secondary audio device, may communicate with each other via a link 230, which may be an example of a Bluetooth link between the wireless audio device 130-*a* and the wireless audio device 130-*b*.

The device 115 may communicate with the wireless audio device 130-*a* and/or the wireless audio device 130-*b* via one or more central devices 105. To illustrate, the device 115 may communicate with a first central device 105 via the link 210-*a* and/or the link 210-*b*. The first central device 105 may be connected to a second central device 105, and the second central device 105 may be connected to the wireless audio device 130-*a* and/or the wireless audio device 130-*b* via the link 210-*c* and/or the link 210-*d*. Accordingly, the device 115 may communicate with the wireless audio device 130-*a* and/or the wireless audio device 130-*b* based at least in part on communicating with the first central device 105, the first central device 105 communicating with the second central device 105, and the second central device 105 communicating with the wireless audio device 130-*a* and/or the wireless audio device 130-*b*. However, in other examples, the device 115, the wireless audio device 130-*a*, and/or the wireless audio device 130-*b* may be connected to a same central device 105.

In some examples, the device 115, the wireless audio device 130-*a*, and the wireless audio device 130-*b* may support or belong to an XPAN and may use the XPAN to support one or more applications or use cases, such as applications or use cases associated with latency or lossless audio constraints or criteria. For example, the device 115 may support one or more use cases of ULL gaming and streaming lossless audio to the wireless audio device 130-*a* and the wireless audio device 130-*b* (for example, personal devices of the device 115). For such applications, the device 115 may be expected to keep end-to-end latency below a relatively stringent latency target (for example, 40 milliseconds (ms) for ULL gaming). Further, the device 115 may also be tasked with handling (for example, gracefully handling without a hard disconnect and/or loss of data) a coexistence of XPAN traffic (for example, traffic to or from one or both of the wireless audio device 130-*a* and the wireless audio device 130-*b*) with other concurrency scenarios the user 205 or the system may initiate. Such other concurrency scenarios may include a scan concurrency for channel selection, STA infrastructure link concurrency for online gaming or other traffic to or from the central device 105, or neighbor aware networking (NAN) discovery and NAN data transfer, or any combination thereof.

The device 115 may have an operating condition and/or an operating specification to meet, such as a data transfer latency operating condition for various applications or use cases (for example, an ultra-low-latency constraint for a ULL gaming use case) and also facilitate coexistence between XPAN and other concurrency scenarios on the device 115. To meet the latency operating condition associated with, for example, ULL gaming, a power constraint of the wireless audio device 130-*a* and the wireless audio device 130-*b*, and/or power and concurrency constraints at the device 115, the device 115 may employ a TWT technique for the communication between the device 115 (which may act or function as an SAP) and each of the wireless audio device 130-*a* and wireless audio device 130-*b* (which may act or function as STAs). Alternatively, or additionally, the device 115 may employ one or more power saving mode time synchronization techniques as described below.

Example TWT parameters include a TWT 235, a TWT SI 240, and a TWT service period (SP) 245. A TWT 235 may indicate or be associated with a timing synchronization function (TSF) time indicating a start or beginning of a first TWT session. A TWT SI 240 may indicate a TWT interval, which may refer to a time difference between a start or beginning of two consecutive TWT sessions. A TWT SP 245 may indicate a duration during which one or both of the wireless audio device 130-*a* and the wireless audio device 130-*b* are awake during a TWT SI 240. In some aspects, a TWT SP 245 may be referred to or understood as a TWT session. As illustrated by FIG. 2, the TWT SI 240 may indicate a time difference between a TWT SP 245-*a* and a TWT 245-*b*. A remainder of time within a TWT SI 240 excluding a TWT SP 245 may be referred to or understood as a concurrency time 250 during which the device 115 may perform any operations (for example, transmission or reception) associated with a concurrency scenario at the device 115. In other words, the difference between XPAN TWT SI 240 and XPAN TWT SP 245 may be the time left for the device 115 to support other concurrencies (for example, outside of any channel switching or software overheads).

For XPAN, each of the wireless audio device 130-*a* and the wireless audio device 130-*b* (which may be examples of TWT requesting STAs) may initiate a TWT session with the device 115 (which may be an example of a TWT responding STA). Further, for low-latency use cases (for example, ULL gaming use cases), a target end-to-end latency may be relatively stringent (for example, less than or equal to approximately 40 ms), which may be tied to, associated with, or expect a Wi-Fi latency in a specific range (for example, in the sub-10 ms range). To achieve such a Wi-Fi latency, a TWT SI 240 and a TWT SP 245 may be selected or set to specific values (for example, a TWT SI 240 may be set to 4 ms with a TWT SP 245 of 2 ms). Further, for a lossless audio use case, for example, a TWT SI 240 may be set to approximately 70 ms with a TWT SP 245 of approximately 23 ms.

Figure 3:
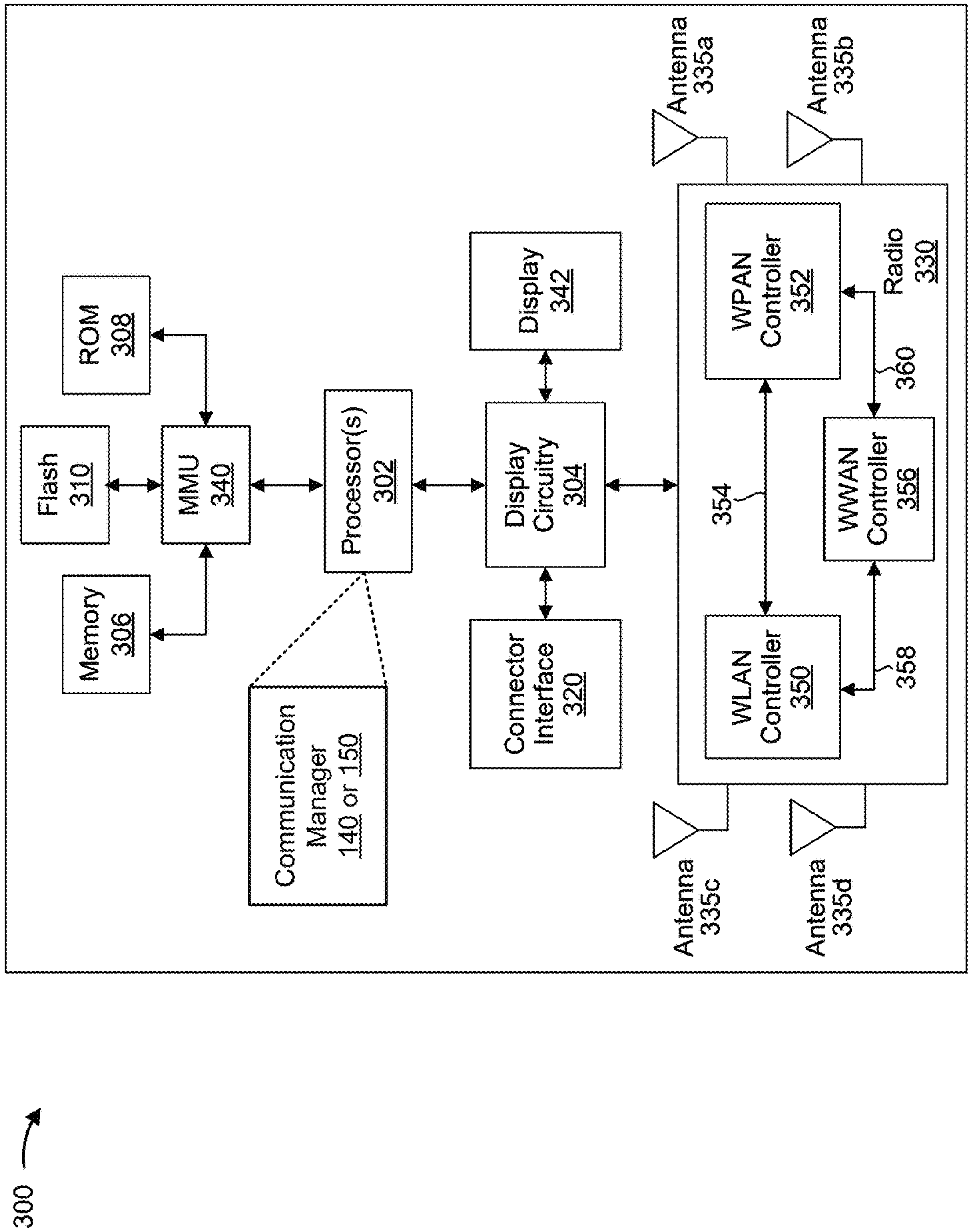
FIG. 3 is a diagram illustrating an example of a wireless communication device, in accordance with the present disclosure.

FIG. 3 is a diagram illustrating an example of a wireless communication device 300, in accordance with the present disclosure. In some aspects, the wireless communication device 300 may be an example of the central device 105, the device 115, and/or the wireless audio device 130 described above. In some examples, the central device 105, the device 115, and/or the wireless audio device 130 may include one or more wireless communication devices 300 and/or one or more components of wireless communication device 300.

Figure 25:
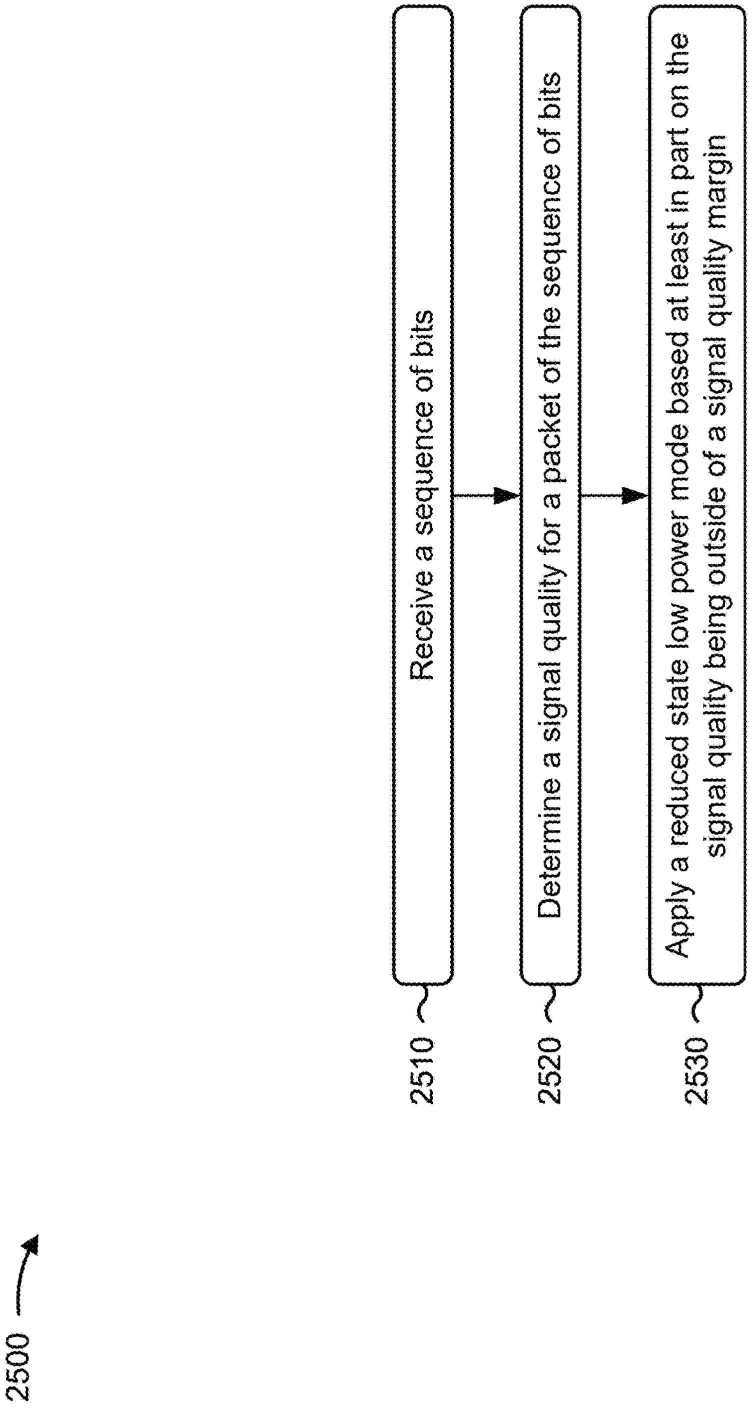
FIG. 25 is a diagram illustrating an example process performed, for example, at a wireless receiver or an apparatus of a wireless receiver, in accordance with the present disclosure.

In some examples, the wireless communication device 300 is configured to perform the process 2500 of FIG. 25. The wireless communication device 300 may include one or more chips, system-on-chips (SoCs), chipsets, packages, components or devices that individually or collectively constitute or comprise a processing system. The processing system may interface with other components of the wireless communication device 300, and may generally process information (such as inputs or signals) received from such other components and output information (such as outputs or signals) to such other components. In some examples, an example chip may include a processing system, a first interface to output or transmit information and a second interface to receive or obtain information. For example, the first interface may refer to an interface between the processing system of the chip and a transmission component, such that the wireless communication device 300 may transmit the information output from the chip. In such an example, the second interface may refer to an interface between the processing system of the chip and a reception component, such that the wireless communication device 300 may receive information that is passed to the processing system. In some such examples, the first interface also may obtain information, such as from the transmission component, and the second interface also may output information, such as to the reception component.

As shown in FIG. 3, the wireless communication device 300 may include processor (or "processing") circuitry in the form of one or multiple processors, such as processor(s) 302. The processor (or "processing") circuitry may be in the form of one or multiple processors, microprocessors, processing units (such as central processing units (CPUs), graphics processing units (GPUs), neural processing units (NPUs) (also referred to as neural network processors or deep learning processors (DLPs)), or digital signal processors (DSPs)), processing blocks, application-specific integrated circuits (ASIC), programmable logic devices (PLDs) (such as field programmable gate arrays (FPGAs)), or other discrete gate or transistor logic or circuitry (all of which may be generally referred to herein individually as "processors" or collectively as "the processor" or "the processor circuitry"). One or more of the processors may be individually or collectively configurable or configured to perform various functions or operations described herein. The processor(s) 302 may execute program instructions for the wireless communication device 300. One or more of the processor(s) 302 may be individually or collectively configurable or configured to perform various functions or operations described herein. A group of processor(s) 302 collectively configurable or configured to perform a set of functions may include a first processor configurable or configured to perform a first function of the set and a second processor configurable or configured to perform a second function of the set, or may include the group of processors all being configured or configurable to perform the set of functions.

The wireless communication device 300 may also include a display 342 that can perform graphics processing and present information to a user. The processor(s) 302 may also be coupled to memory management unit (MMU) 340, which may be configured to receive addresses from the processor (s) 302 and translate the addresses to address locations in memory such as memory 306, read-only memory (ROM) 308, or flash memory 310 and/or to address locations in other circuits or devices, such as the display circuitry 304, radio 330, connector interface 320, and/or display 342. The MMU 340 may also be configured to perform memory protection and page table translation or set up. In some aspects, the MMU 340 may be included as a portion of the processor(s) 302. In some aspects, the wireless communication device 300 may include a communication manager (for example, communication manager 140) that controls the wireless communication device 300 or processor(s) 302 to perform the processes described herein.

In some examples, the processing system may further include memory circuitry in the form of one or more memory devices, memory blocks, memory elements or other discrete gate or transistor logic or circuitry, each of which may include tangible storage media such as random-access memory (RAM) or ROM, or combinations thereof (all of which may be generally referred to herein individually as "memories" or collectively as "the memory" or "the memory circuitry"), such as the memory 306, ROM 308, and/or flash memory 310. One or more of the memories may be coupled with one or more of the processors and may individually or collectively store processor-executable code that, when executed by one or more of the processors, may configure one or more of the processors to perform various functions or operations described herein. Additionally or alternatively, in some examples, one or more of the processors may be preconfigured to perform various functions or operations described herein without requiring configuration by software. The processing system may further include or be coupled with one or more modems (such as a Wi-Fi (for example, IEEE compliant) modem or a cellular (for example, 3GPP 4G LTE, 5G or 6G compliant) modem). In some implementations, one or more processors of the processing system include or implement one or more of the modems. The processing system may further include or be coupled with multiple radios (collectively "the radio"), multiple RF chains or multiple transceivers, each of which may in turn be coupled with one or more of multiple antennas. In some implementations, one or more processors of the processing system include or implement one or more of the radios, RF chains or transceivers.

The processor(s) 302 may be coupled to other circuits of the wireless communication device 300. For example, the wireless communication device 300 may include various memory types, a connector interface 320 through which the wireless communication device 300 can communicate with the computer system, and wireless communication subsystems that can transmit data to, and receive data from, other devices based on one or more wireless communication standards or protocols. For example, in some aspects, the wireless communication subsystems may include (but are not limited to) a WLAN subsystem, a WPAN subsystem, and/or a cellular subsystem (such as a Long-Term Evolution (LTE) or New Radio (NR) subsystem). The wireless communication device 300 may include multiple antennas 335*a*, 335*b*, 335*c*, and/or 335*d* for performing wireless communication with, for example, wireless communication devices in a WPAN.

The wireless communication device 300 may be configured to implement part or all of the techniques described herein by executing program instructions stored on a memory medium (such as a non-transitory computer-readable memory medium) and/or through hardware or firmware operation. In other embodiments, the techniques described herein may be at least partially implemented by a programmable hardware element, such as a field-programmable gate array (FPGA), and/or an application specific integrated circuit (ASIC).

In certain aspects, the radio 330 may include separate controllers configured to control communications for various respective radio access technology (RAT) protocols. For example, as shown in FIG. 3, radio 330 may include a WLAN controller 350 that manages WLAN communications, a WPAN controller 352 that manages Bluetooth, BLE, and/or other suitable WPAN communications, and a wireless wide area network (WWAN) controller 356 that manages WWAN communications. In some aspects, the wireless communication device 300 may store and execute a WLAN software driver for controlling WLAN operations performed by the WLAN controller 350, a WPAN software driver for controlling WPAN operations performed by the WPAN controller 352, and/or a WWAN software driver for controlling WWAN operations performed by the WWAN controller 356.

In some aspects, a first coexistence interface 354 (such as a wired interface) may be used for sending information between the WLAN controller 350 and the WPAN controller 352. Additionally, or alternatively, in some aspects, a second coexistence interface 358 may be used for sending information between the WLAN controller 350 and the WWAN controller 356. Additionally, or alternatively, in some aspects, a third coexistence interface 360 may be used for sending information between the WPAN controller 352 and the WWAN controller 356. In some examples, one or more of the WLAN controller 350, the WPAN controller 352, and/or the WWAN controller 356 may be implemented as hardware, software, firmware or some combination thereof.

In some aspects, the WLAN controller 350 may be configured to communicate with a second device in a WPAN using a WLAN link using one or more, some, or all of the antennas 335*a*, 335*b*, 335*c*, and 335*d*. In other configurations, the WPAN controller 352 may be configured to communicate with at least one second device in a WPAN using one or more, some, or all of the antennas 335*a*, 335*b*, 335*c*, and 335*d*. In other configurations, the WWAN controller 356 may be configured to communicate with a second device in a WPAN using one or more, some, or all of the antennas 335*a*, 335*b*, 335*c*, and 335*d*. The WLAN controller 350, the WPAN controller 352, and/or the WWAN controller 356 may be configured to adjust a wakeup time interval and a shutdown time for the wireless communication device 300.

A short-range wireless communications protocol, such as Bluetooth (BT), BLE, and/or basic rate (BR)/enhanced data rate (EDR), may include and/or may use one or more other communications protocols, for example, to establish and maintain communications links. In some examples, the wireless communication device 300 may establish a communications link with one or more peripheral devices, such as a wireless headset or wireless earbuds, according to at least one communications protocol for short-range wireless communications. In some aspects, the communications link may include a communications link that adheres to a protocol included and/or for use with BT, BLE, and/or BR/EDR, among other examples. In one aspect, the communications link may include an asynchronous connection-oriented logical transport, sometimes referred to as an ACL link. When operating as an ACL link, the communications link may allow the wireless communication device 300 to connect or "pair" with a peripheral device. The connection is asynchronous in that the two devices may not need to synchronize, timewise, data communications between each other to permit communication of data packets via the communications link.

In some examples, a logical link control and adaptation protocol (L2CAP) may be used within a BT protocol stack (not shown in FIG. 3). An L2CAP connection may be established after an ACL link has been established. Reference to L2CAP in the present disclosure may be further applicable to enhanced L2CAP (EL2CAP), which may be an enhanced version of the L2CAP protocol that enables multiplexing of multiple logical data channels via a single radio connection.

In some examples, the communications link may include an A2DP link. For example, an A2DP link may provide a point-to-point link between a source device, such as the wireless communication device 300, and a sink device, such as the wireless earbuds 130-*a* and 130-*b*. With an A2DP link, data packets including audio may be transmitted over an ACL channel, and other information (for example, for controlling the audio stream) may be transmitted over a separate control channel. The data packets may occur non-periodically.

In some examples, the communications link may support synchronous logical transport mechanisms between a source device and a peripheral device. For example, the communications link 125 may include an SCO link that provides a symmetric point-to-point link between the source device and the peripheral device using time slots reserved for BT communications. In some aspects, an SCO link may not support retransmission of data packets, which may be unsatisfactory in audio streaming and/or voice call use cases in which a dropped audio or voice packet may reduce the quality of the user experience. Accordingly, in some aspects, the communications link may include an eSCO link. An eSCO link may provide a symmetric or asymmetric point-to-point link between a source device and a peripheral device using time slots reserved for BT communications, and may also provide for a retransmission window following the reserved time slots. Because retransmissions may be facilitated using the retransmission window, an eSCO link may be suitable for audio streaming and/or voice call use cases because a dropped audio or voice packet may be retransmitted, and therefore the probability of successfully receiving a data packet may be increased.

In some aspects, the communications link may include an isochronous (ISO) link. When operating as an ISO link, the communications link 125 may combine some features of both synchronous and asynchronous links. For example, a stream on an ISO link may begin with a start packet, and then data packets may be asynchronously transmitted. On an ISO link, the number of retransmission attempts by a transmitting device may be limited. Thus, if a receiving device is unable to decode a data packet within the limited number of retransmission attempts, then the data packet may be dropped, and the receiving device may continue to receive the stream without data from the dropped data packet.

In some aspects, a wireless receiver (e.g., a central device 105, a device 115) includes means for determining a signal quality for a packet of the sequence of bits; and/or means for applying a reduced state low power mode based at least in part on the signal quality being outside of a signal quality margin. In some aspects, the means for the wireless communication device 300 to perform operations described herein may include, for example, one or more of antennas 335*a*-335*d*, WPAN controller 352, WLAN controller 350, radio 330, communication manager 140 or 150, and/or processor 302, among other examples.

The number and arrangement of components shown in FIG. 3 are provided as an example. In practice, device 300 may include additional components, fewer components, different components, or differently arranged components than those shown in FIG. 3. Additionally, or alternatively, a set of components (for example, one or more components) of device 300 may perform one or more functions described as being performed by another set of components of device 300.

Some aspects and techniques as described herein may be implemented, at least in part, using an artificial intelligence (AI) program (for example, referred to herein as an "AI/ML model"), such as a program that includes a machine learning (ML) model and/or an artificial neural network (ANN) model. The AI/ML model may be deployed at one or more devices (for example, one or more network nodes, one or more APs, one or more devices, and/or one or more servers, and/or one or more components of a cloud computing network, among other examples). For example, in an deployment where AI/ML functionality is performed independently at a device, sometimes referred to as "overlay AI/ML", the AI/ML model (or an instance or portion of the AI/ML model) may be deployed at a device (for example, at the device 300), a network node, an AP, one or more servers, and/or one or more components of a cloud computing network, among other examples. Additionally or alternatively, in a deployment where AI/ML functionality is coordinated between different devices, sometimes referred to as "coordinated AI/ML", or performed at all device and network layers, sometimes referred to as "native AI/ML", the AI/ML model (or an instance of the AI/ML model) may be deployed at multiple devices (for example, a first portion of the AI/ML model may be deployed at a device and a second portion of the AI/ML model may be deployed at an AP). In other examples of coordinated AI/ML and/or native AI/ML, a first AI/ML model may be deployed at a device and a second AI/ML model may be deployed at an AP. The AI/ML model(s) may be configured to enhance various aspects of the wireless communication network (for example, to increase privacy, reliability, and/or efficient use of network bandwidth, and/or to reduce latency, among other examples). For example, the AI/ML model(s) may be trained to identify patterns or relationships in data corresponding to the wireless communication network, a device, and/or an air interface, among other examples. The AI/ML model(s) may support operational decisions relating to one or more aspects associated with wireless communications devices, networks, or services.

Accordingly, in some examples, the AI/ML model(s) may enable AI-as-a-Service (for example, an end-to-end AI/ML service via a user plane) for use cases such as a self-organizing network (SON), minimization of drive test (MDT), quality of experience (QoE), positioning, sensing, predictive mobility, and/or traffic prediction, among other examples). In some examples, AI-as-a-Service use cases may include measurement collection reporting by a device, device selection criteria (for example, according to a geographical area where measurements are to be collected and/or device capabilities to be used to collected measurements), and/or reporting configurations (for example, reporting parameters such as location, time, and/or sensor information, among other examples). Additionally or alternatively, the AI/ML model(s) may enable AI/ML procedures (for example, service establishment, configuration, inferencing using UE-side and/or network-side models, performance monitoring and/or management, and/or capability signaling, among other examples). Additionally or alternatively, the AI/ML model(s) may enable AI/ML services via one or more application program interfaces (APIs) and/or management interfaces for use cases such as beam management, radio resource monitoring (RRM) relaxation, mobility prediction, load prediction, network energy savings, and/or coverage and capacity improvements, among other examples).

A communication system may have a single-carrier communication system and convolution encoding. The communication system may be subject to multi-path channels (transmitted signals reach the receiver through multiple paths, including reflection, refraction, scattering, and diffraction) causing inter-symbol interference (ISI) with a delay spread equivalent to a low number of symbols. Therefore, when using a low number of symbols (e.g., ≤5 symbols) for channel memory, such as for a PAN communication system, the performance may be limited. The communication system may not implement direct sequence spectrum spreading (DSSS) and may have similar characteristics as BT high data throughput (HDT) or a high speed system. The communication system may suffer from significant performance loss if the multi-path environment is not taken into consideration, including HDT data rates. Assume examples of BT HDT 2 Mbps and 6 Mbps. The higher the bandwidth and the shorter the symbol duration, the more severe the effect that multi-path has on the performance. The packet error rate may not be better than 10% for 6 Mbps and 2% for 2 Mbps for a 52-byte packet when multi-path is not accounted for in the receiver design.

A Viterbi decoder is an algorithm used for decoding convolutional codes in digital communications. Convolutional codes are error-correcting codes used to encode data before transmission. Unlike block codes, where the data is split into fixed-size blocks, convolutional codes process data streams through a sequence of shifts and taps, producing encoded bits that depend on the current input bit as well as previous input bits. Convolutional encoding involves shifting a sequence of input bits through a series of memory elements (shift registers) and applying a set of polynomial functions (generators) to produce the encoded output.

The Viterbi algorithm is used to decode the received sequence and determine the most likely transmitted sequence of bits. It operates using state diagrams. The convolutional encoder can be represented by a state diagram where each state corresponds to a possible configuration of the encoder's memory. Transitions between states are based on input bits. The Viterbi algorithm uses a trellis diagram to systematically track the most likely sequence of states over time. Each stage in the trellis represents a time step, and each path through the trellis represents a possible sequence of states. As the received sequence is processed, the Viterbi algorithm calculates a metric (often the Hamming distance or Euclidean distance) for each path in the trellis. This metric measures how closely the path matches the received sequence. At each stage, the Viterbi decoder keeps track of the survivor paths, which are the most likely paths through the trellis that lead to each state. This is done by comparing the metrics of different paths and retaining only the most likely ones. After processing the entire received sequence, the Viterbi decoder traces back from the final state to determine the most likely sequence of states and, consequently, the most likely transmitted data sequence.

The Viterbi Algorithm includes an initialization step to set the initial state metrics and initialize the trellis. For each time step, the branch metrics are computed for each possible state transition based on the received sequence, and the trellis is updated. At each state, the path with the lowest metric (most likely) is selected, and less likely paths are discarded. After processing the entire sequence, a traceback through the trellis is recorded to determine the most likely path, which corresponds to the decoded data sequence. The Viterbi algorithm provides an optimal decoding solution for convolutional codes, to find the most likely transmitted sequence given the received sequence. A super trellis is a trellis that addresses both equalization and decoding, and that leads to the architecture or to the structure of joint Viterbi decoder and equalizer.

There are various ways to address multi-path issues. Some ways may include maximum likelihood (ML) sequence estimation (MLSE) (highest performance, highest complexity), which uses and joint Viterbi equalization and decoding. Another way is ML Symbol Estimation followed by ML sequence estimation (Split MLSE) (medium sub-optimal performance, high complexity), which uses split Viterbi equalization followed by Viterbi decoding. MLSE is basically split into two parts, Viterbi equalization first and then Viterbi decoding. Viterbi equalization is performed encoded symbols, and the coding gain from convolutional encoding does not improve equalization. Another way to perform equalization is linear minimum mean square estimator (LMMSE) (low, sub-optimal performance, low complexity), which uses a finite impulse response (FIR) filter to minimize inter-symbol interference (ISI), and a demapper followed by a Viterbi decoder. The FIR filter produces an estimate of a symbol in a constellation diagram, as if using a traditional receiver for an additive white Gaussian noise (AWGN) channel and then the demapper is followed by a conventional Viterbi decoder. However, the effect of a significant ISI cannot be eliminated at a high signal-to-interference-plus-noise ratio (SINR). Yet another way includes a decision-feedback equalizer MMSE (DFE-MMSE) (medium sub-optimal performance, medium complexity), which may be viewed as an LMMSE with extra taps for uncoded symbol decisions. This way suffers especially when encoding is strong and uncoded symbol decisions are poor. The equalization is split from decoding, the coding gain is not utilized during the equalization, and the effect of a significant ISI cannot be eliminated fully by this filtering, because the filtering is linear and the system model including the channel model indicates that the effect of multi-path cannot be fully removed using the DFE-MMSE approach. While MLSE provides for the highest performance, it also has the highest complexity, which appears to make this way prohibitive.

Figure 4:
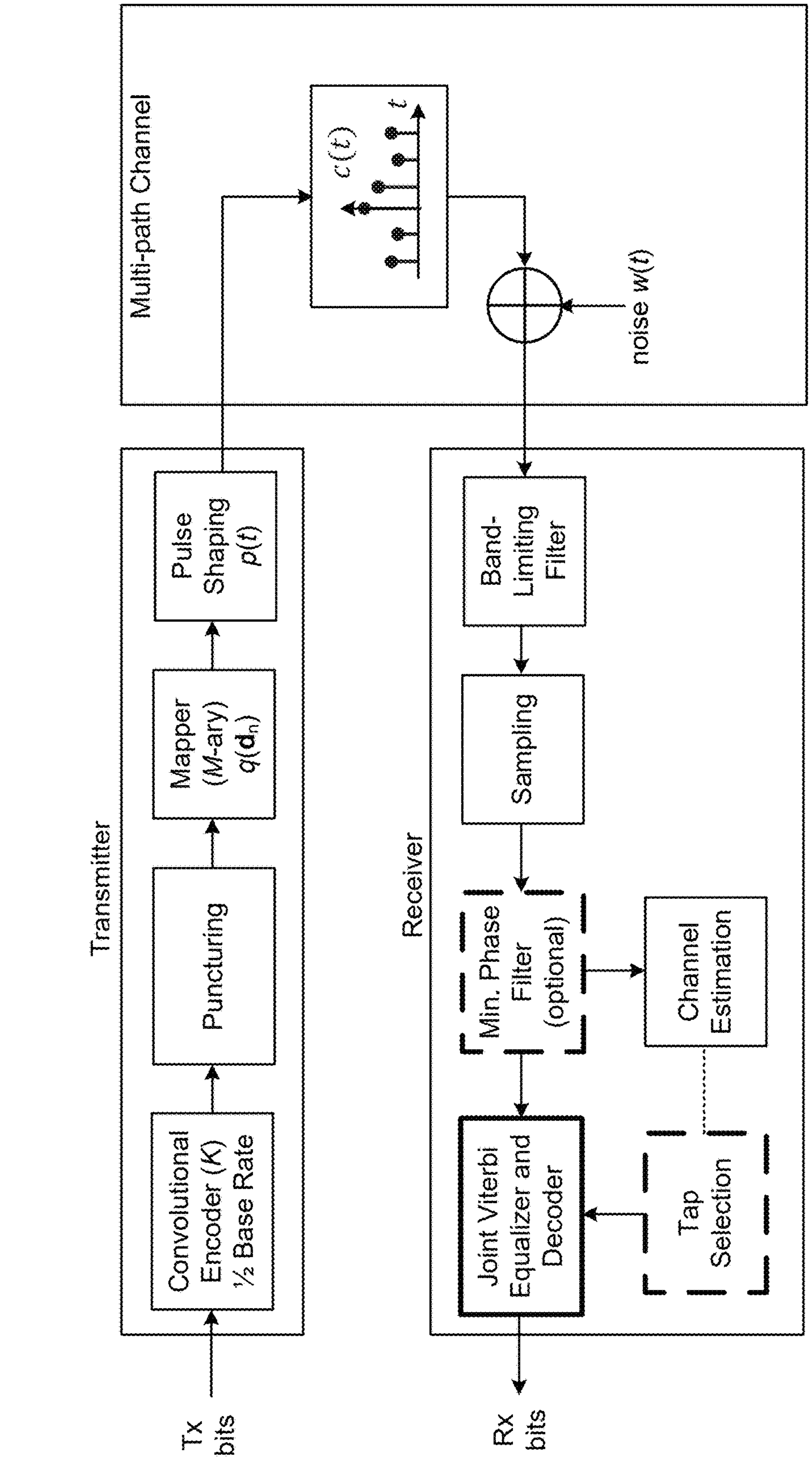
FIG. 4 is a diagram illustrating an example of maximum likelihood sequence estimation (MLSE), in accordance with the present disclosure.

FIG. 4 is a diagram illustrating an example 400 of MLSE, in accordance with the present disclosure.

Example 400 shows transmit bits that are input into a convolutional encoder of a transmitter with a base rate of ½. Puncturing may then be applied. Puncturing patterns may be applied for different data rates that are supported. Punctured bits are grouped into groups of bits that are mapped by a mapper onto the constellation of the symbols which are going to be transmitted. The output of the mapper is constellation symbols in the in-phase and quadrature (IQ) domain, for example phase-shift keying (PSK) and their differential variants, or quadrature amplitude modulations (QAM). Symbols at the symbol rate then pass through the pulse shaping. The signal is then transmitted and propagated through a communication channel.

Example 400 also shows a multi-path channel model that has a channel impulse response as a function c(t) with multiple taps. The convolved signal is being added with additive white Gaussian noise (AWGN), denoted by a sliding window transform (SWT).

The bits from the multi-path channel may be filtered with a band-limiting filter to remove the out-of-band noise. After sampling of the signal, an optional minimum phase filter may shorten the channel impulse response (the channel impulse response could be relatively long if the channel has a long delay spread). There may be more than a low number of symbols (e.g., 5 symbols) worth of delay spread, but the minimum phase filter (e.g., optional FIR filter) may shorten the channel impulse response so that the implementation of the joint Viterbi equalizer and decoder is not too expensive (e.g., high processing complexity), because there is a relationship between the length of this channel impulse response and the complexity of this joint Viterbi equalizer and decoder. The example in the present disclosure illustrates up to 3 symbols worth of the delay spread for the processing in the joint Viterbi equalizer and decoder, however the actual suitable number will depend on permissive hardware complexity in the given application. The channel impulse response is estimated by channel estimation. There may be a certain number of taps in the channel estimate, but not all of the tabs may actually contribute to the overall performance meaningfully. This is the case if their relative energy compared to the energy of all the taps is sufficiently low. Hence.

As indicated above, FIG. 4 is provided as an example. Other examples may differ from what is described with regard to FIG. 4.

Figure 5:
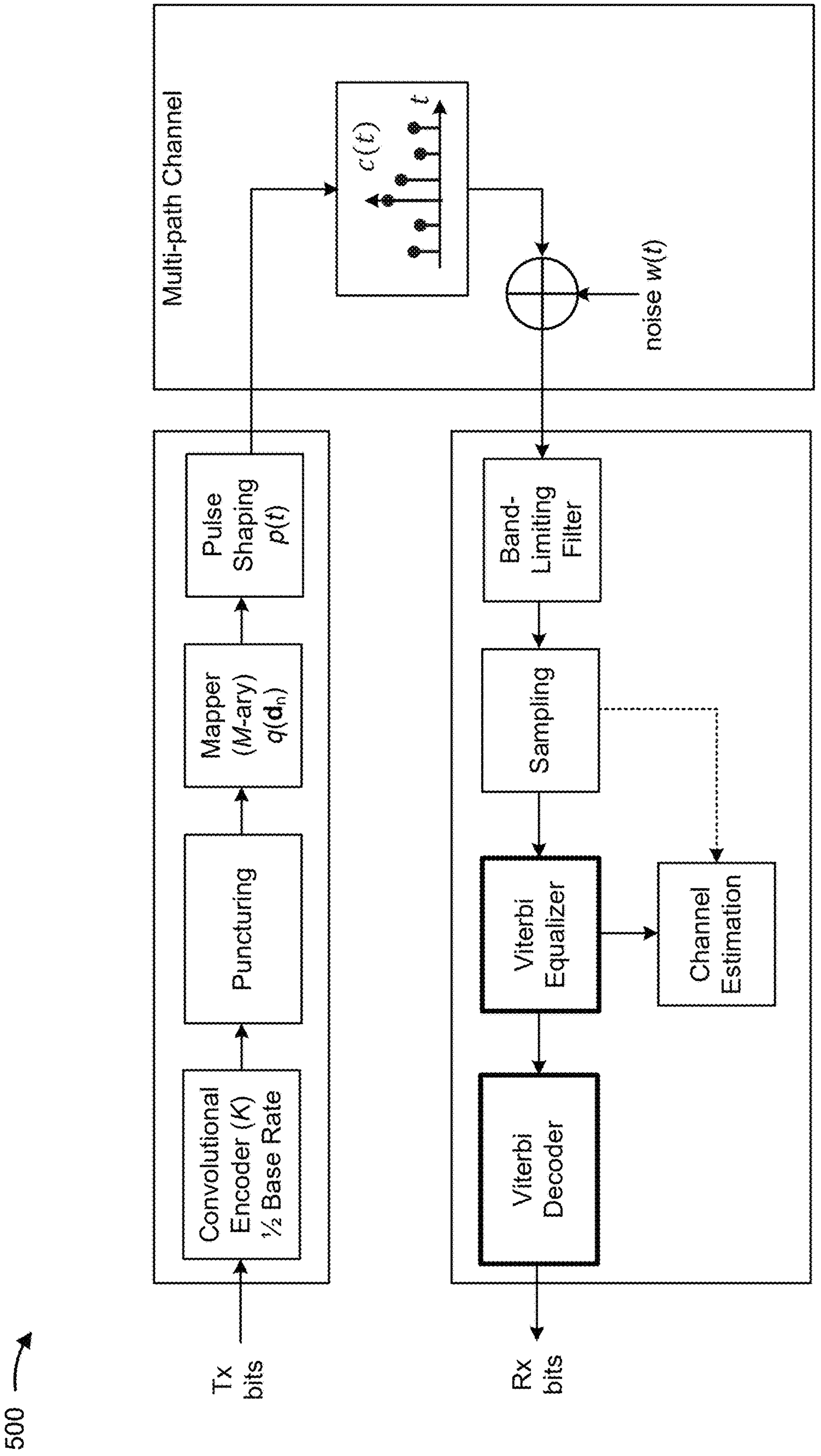
FIG. 5 is a diagram illustrating an example of a split MLSE, in accordance with the present disclosure.

FIG. 5 is a diagram illustrating an example 500 of a split MLSE, in accordance with the present disclosure.

In example 500, the Viterbi equalizer and the Viterbi decoder are split. The Viterbi equalizer uses the channel estimate to remove ISI and provide estimates of IQ symbols, which may be sliced and delivered as bit log-likelihood ratios (LLRs) to the Viterbi decoder. The Viterbi decoder provides the estimates of the transmitted bits (Rx bits).

As indicated above, FIG. 5 is provided as an example. Other examples may differ from what is described with regard to FIG. 5.

Figure 6:
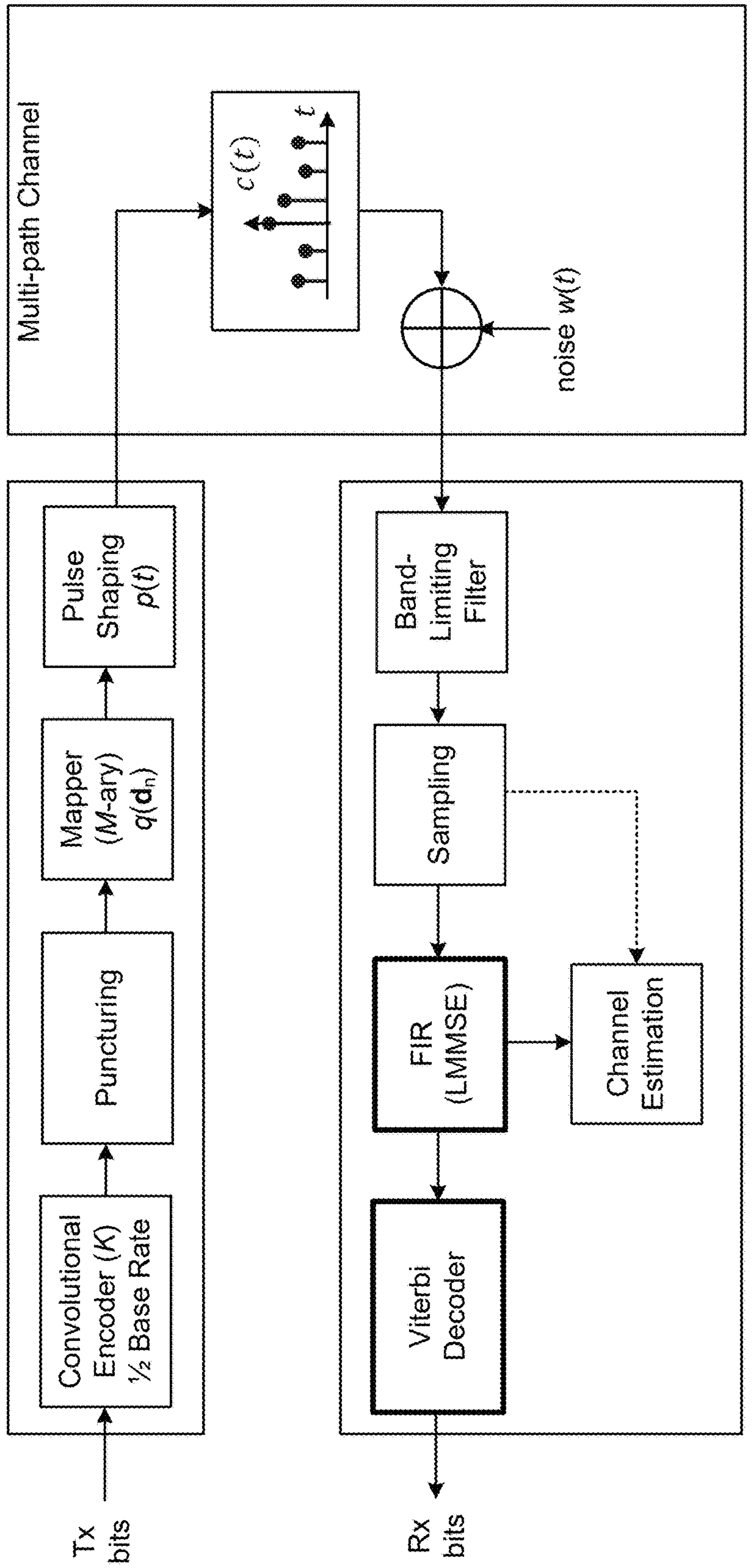
FIG. 6 is a diagram illustrating an example of a linear minimum mean square estimator (LMMSE), in accordance with the present disclosure.

FIG. 6 is a diagram illustrating an example 600 of an LMMSE, in accordance with the present disclosure.

In example 600, the sampling of the ISI is removed by an FIR filter. The channel taps are calculated based on channel estimates. Optionally, the channel estimate may be truncated if there are too many taps.

As indicated above, FIG. 6 is provided as an example. Other examples may differ from what is described with regard to FIG. 6.

Figure 7:
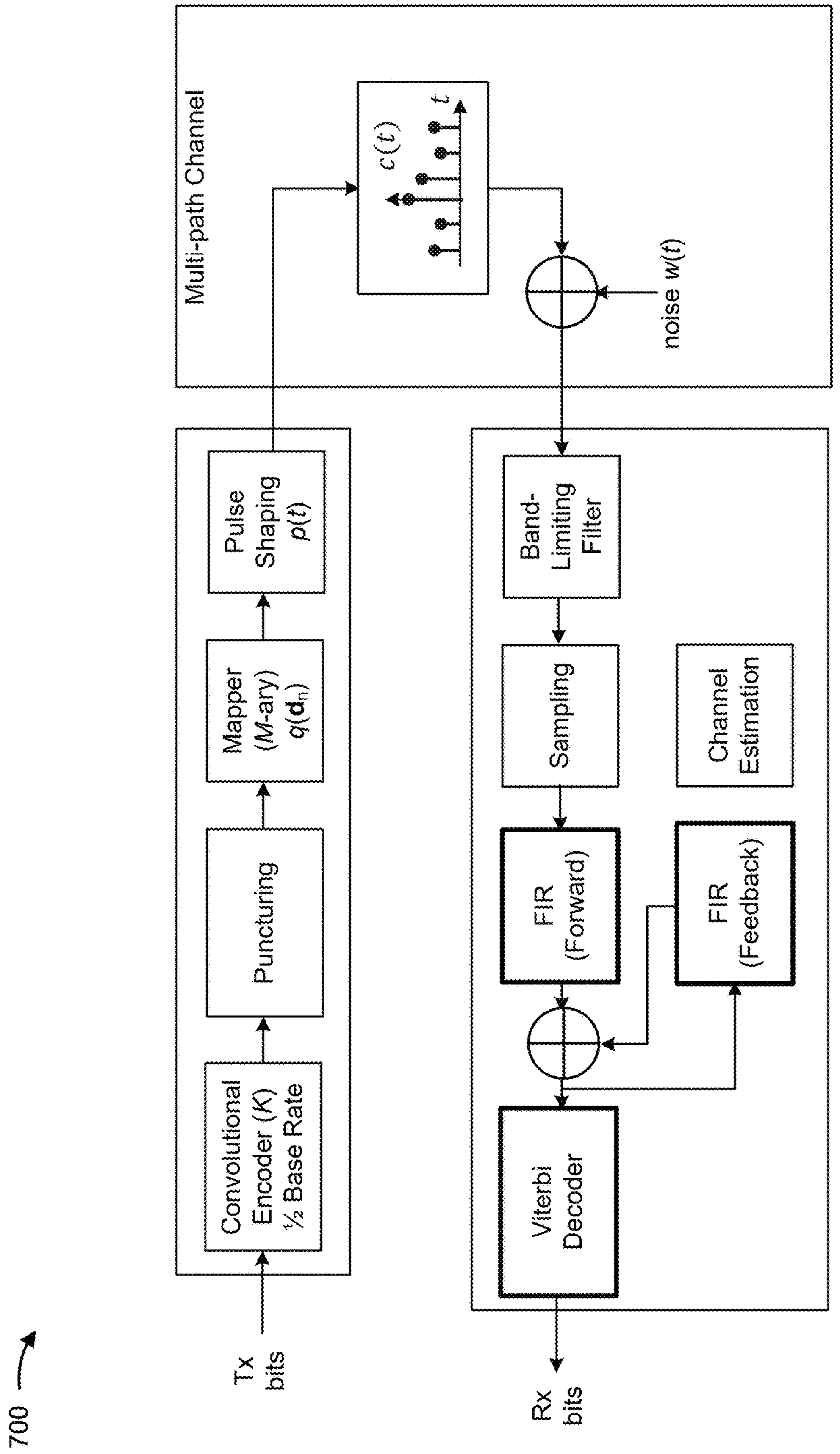
FIG. 7 is a diagram illustrating an example of a decision-feedback equalizer MMSE, in accordance with the present disclosure.

FIG. 7 is a diagram illustrating an example 700 of DFE-MMSE, in accordance with the present disclosure.

Example 700 shows an FIR filter that has IQ symbols at a symbol rate that are in the IQ constellation space. The IQ symbols are sliced and delivered as bit LLRs into the Viterbi decoder. A history of estimates of transmitted IQ (uncoded) symbols are applied to remove ISI. DFE-MMSE uses the decision feedback.

Among examples 400 through 700, the MLSE algorithm of example 400 provides the best performance. For example, for HDT6 (6 Mbps data rate), there is a 10 decibel (dB) performance gain over traditional LMMSE in a typical office environment. This assumes 11n fading non-line-of-sight (NLoS) channel model D, performance measured as packet error rate at 1% of 52-byte payload with 10-byte header and 4-byte cyclic redundancy check (CRC) for Packet Format 0. In this experiment, MLSE assumed M=2 symbols of channel memory. LMMSE assumed L=5 symbols of channel memory. A focus of further discussion is the use of the highest performing algorithm MLSE, leading to the architecture of Joint Viterbi Equalizer and Decoder. Once more, the complexity of the MLSE algorithm is prohibitive to implement in hardware.

As indicated above, FIG. 7 is provided as an example. Other examples may differ from what is described with regard to FIG. 7.

Figure 8:
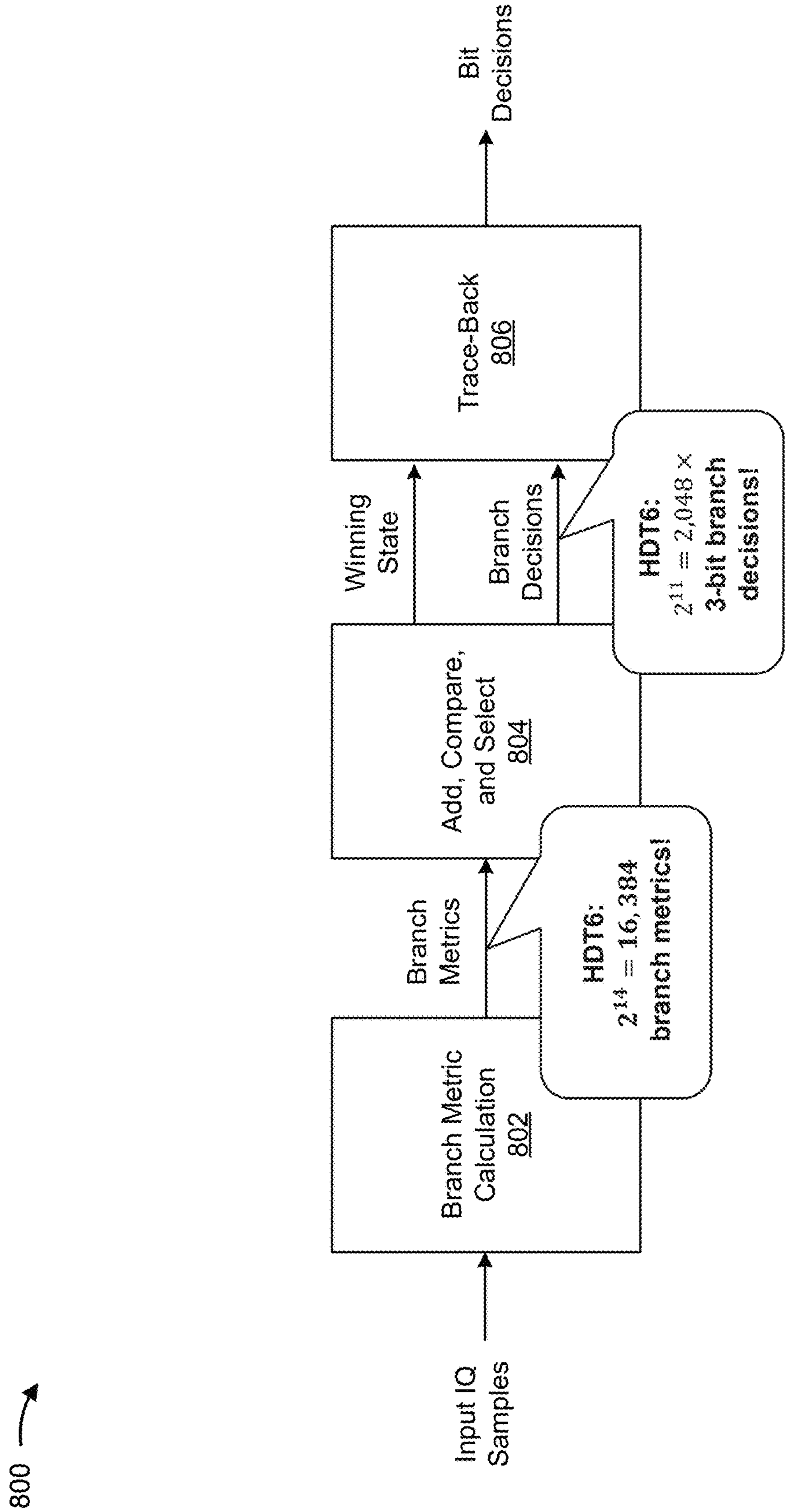
FIG. 8 is a diagram illustrating an example of branch calculations without applying any state reduction for a high-data throughput (HDT) 6 megabits per second (Mbps) data rate.

FIG. 8 is a diagram illustrating an example 800 of branch calculations without applying any state reduction for a BT HDT 6 Mbps data rate.

With the MLSE algorithm, and considering the full trellis, the Viterbi algorithm may be three blocks that run sequentially, such as the branch metric calculation unit 802, the add, compare, and select unit 804, and the trace-back unit 806. The input is IQ samples that are received. The number of samples per symbols may be, for example, one, two, or four samples per symbol.

In example 800 for BT HDT6 (6 Mbps), the channel symbol memory is M=2 samples per symbol, the constraint length of the convolutional code is K=6, the number of Tx bits (prior to coding, puncturing) per symbol is $N_g$=3, the number of branches to be calculated: $2^{(M+1)N_g+K-1}$=16,384 branches. The number of states: $2^{MN_g+K-1}$=2,048 states. We define a state to be associated with a sequence of bits that belong to a symbol at the given time step, i.e., the algorithm is run in the symbol domain. For each of the 2,048 states, a path metric is calculated. In an example, if received samples of the length worth of 20 symbols are received, the 2,048 path metrics would include information for each path accumulated over 20 symbols, but the branch metric would include that information only for that given symbol at that particular time. The branch metric is additional information per symbol. A multi-path channel may greatly increase the size of the trellis. By contrast, a typical Viterbi algorithm may operate with a mere 256 branches.

At the branch metric calculation unit 802, branches and metrics for the branches are calculated. As the add, compare, and select unit 804, the branch metrics are added to path metrics for each state (e.g., 0, 1, 2, 3) of the trellis. This is to be performed for all of the states in the full (whole) trellis. After the path metrics and branch metrics are added together, for each state, the incoming paths into the state are compared. For each state, there is only one path leading to the state that will survive. This path has the best metric within all of the candidate's paths coming to that state. If Euclidean distance is the metric, the path has the lowest Euclidean distance. Branch decisions, i.e., the index of the surviving path per state and each time step, may be stored and ultimately used to trace-back from the winning state to determine the winning path across the whole sequence. The index of the winning state may be used to select the overall winning path, and from the winning path, the trace-back unit 806 may trace back through the full trellis. The trace-back unit 806 may not proceed all of the way back to the first transmitted symbol. Instead, the trace-back unit 806 may proceed back to a determined trace-back length (e.g., 40 symbols).

If the number of states can be reduced from 2,048 states down to the 16 states that have the lowest Euclidean distance or highest correlation matrix, there would be a successful state reduction (with negligible performance loss for HDT6). Note that it is assumed that the branch and path metrics are defined as Euclidean distance in this text for simplicity; however, correlation can be used equivalently if symbol energy is normalized. In a case of using a correlation metric, the winning paths may be the paths that have the maximum correlation. Also, the number of branch metric reduces proportionally. However, there is still computational complexity that consumes processing resource, power, and time, even though the number of states is reduced.

As indicated above, FIG. 8 is provided as an example. Other examples may differ from what is described with regard to FIG. 8.

Figure 9:
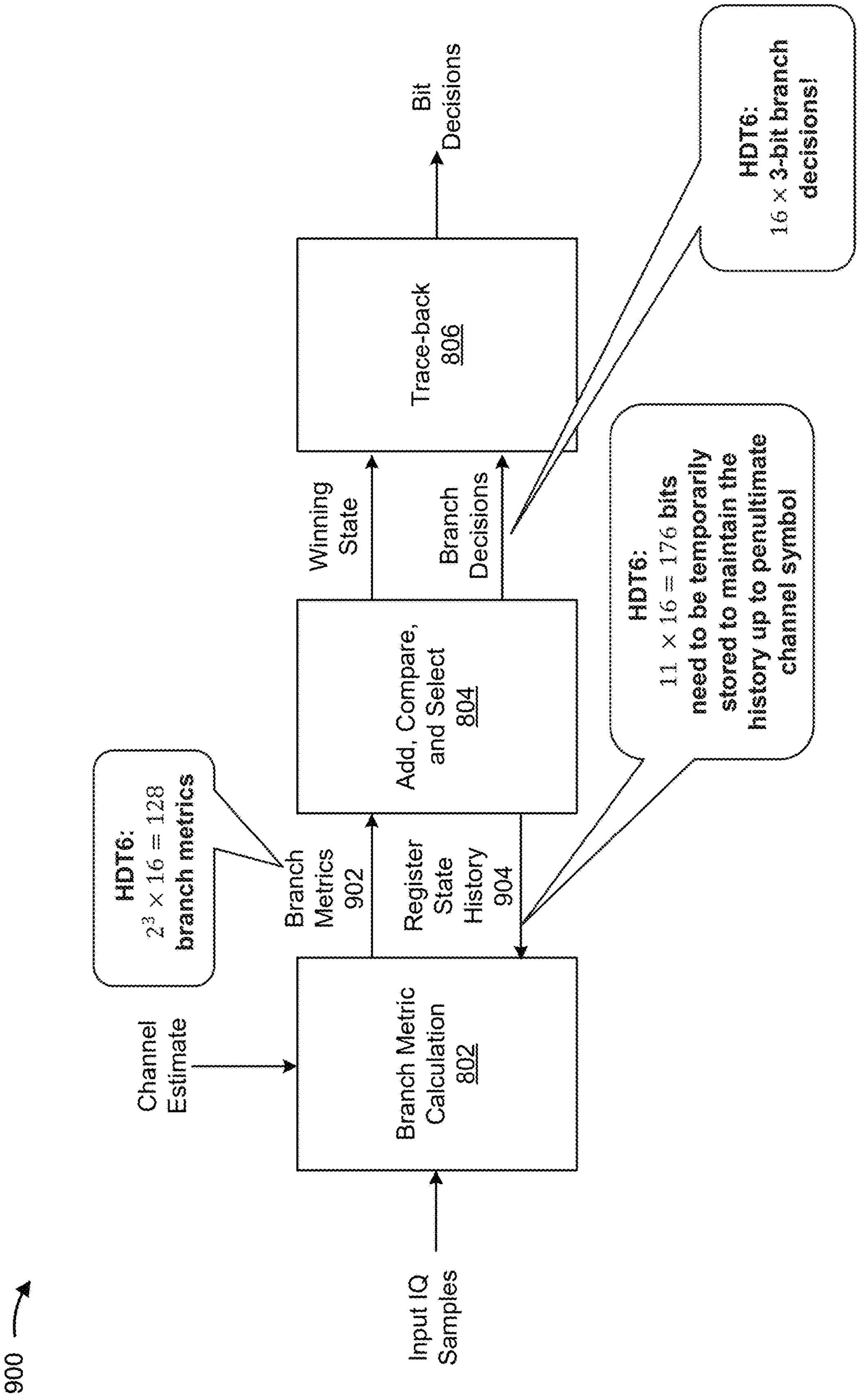
FIG. 9 is a diagram illustrating an example of branch calculations with applying the state reduction for an HDT 6 Mbps data rate, in accordance with the present disclosure.

FIG. 9 is a diagram illustrating an example 900 of branch calculations with applying the state reduction for a BT HDT 6 Mbps data rate, in accordance with the present disclosure.

In some aspects, states in the Viterbi algorithm may be reduced. The state reduction may involve a metric, such a lower Euclidean distance indicates a state that is more likely to be the actual winning state. The state reduction may involve a correlation metric. The higher the correlation value, the more likely that state is to be the winning state. For example, out of 2,048 states, 16 states may have the lowest Euclidean distance. Out of the 2,048 states, the probability of making an error in the final sequence estimation would be small enough, or the loss would be negligible.

As indicated above, FIG. 9 is provided as an example. Other examples may differ from what is described with regard to FIG. 9.

Figure 10:
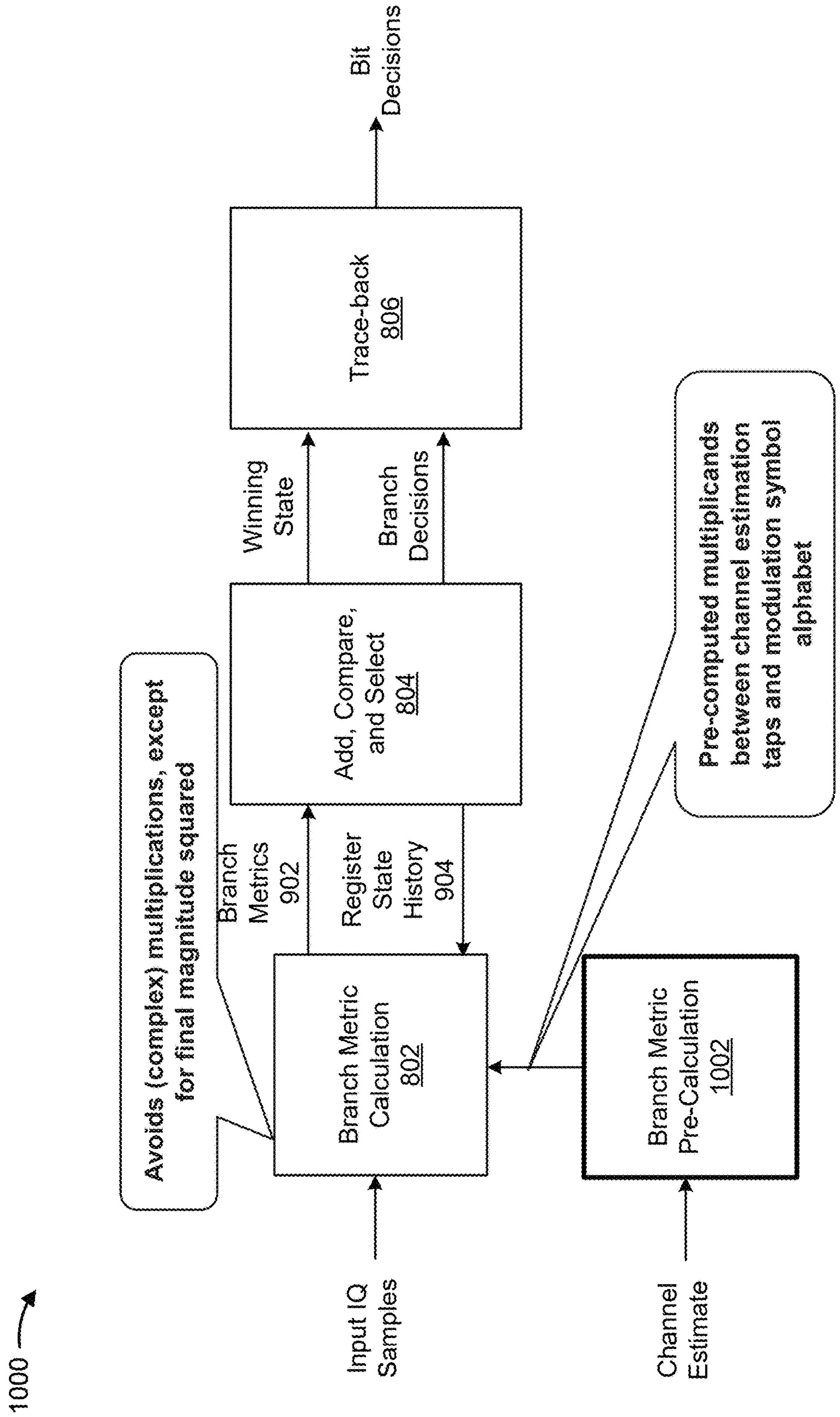
FIG. 10 is a diagram illustrating an example of branch calculations with applying the state reduction and pre-calculating multiplicands of channel estimate taps with intra-phase and quadrature (IQ) symbol candidates for an HDT 6 Mbps data rate, in accordance with the present disclosure.

FIG. 10 is a diagram illustrating an example 1000 of branch calculations with applying the state reduction and pre-calculating multiplicands of channel estimate taps with intra-phase and quadrature (IQ) symbol candidates for a BT HDT 6 Mbps data rate, in accordance with the present disclosure.

In some aspects, a device may pre-calculate and store multiplicands of channel taps for Viterbi state reduction and tracing back through stored states. While there is a reduction in complexity dropping from 2,048 states (or 16,384 branches) to 16 states (or 128 branches), extra information about the index of the state in the original full trellis is to be stored per each current surviving state. For the example of HDT 6 with the 3 parameters above, the device may maintain 11 bits for each state, to be able to calculate the branch metric for that state uniquely. The device may store 11 bits for each of the 16 states (total 176 bits). Each iteration of a symbol may be updated and fed back.

In some aspects, the device may provide feedback information (register state history 904) to the branch metric calculator about which of subset of the branch metrics 902 are to be calculated from all of the possible 2,048 or more branch metrics because this branch metric calculation was previously, meaning without the state reduction, calculating all possible branches blindly.

Branch metrics may include squares of Euclidean distances between received samples and reconstructed samples, where the reconstructed samples are a convolution of channel estimation taps with the considered current symbol and considered past symbol history for the given branch. The elements of the convolutions may be pre-computed and stored.

Example 1000 shows a branch metric pre-calculation unit 1002 that pre-calculates parts of that branch metric calculation. These parts may include multiplicands between all combinations of channel estimation taps and all symbols in the alphabet of the modulation. These computations may involve complex multipliers, which are digital signal processing (DSP) intensive, area intensive, and power intensive. By precomputing at the beginning of the reception of the samples, when the channel estimate and the modulation alphabet is known, a significant number of processing resources are conserved.

As indicated above, FIG. 10 is provided as an example. Other examples may differ from what is described with regard to FIG. 10.

Figure 11:
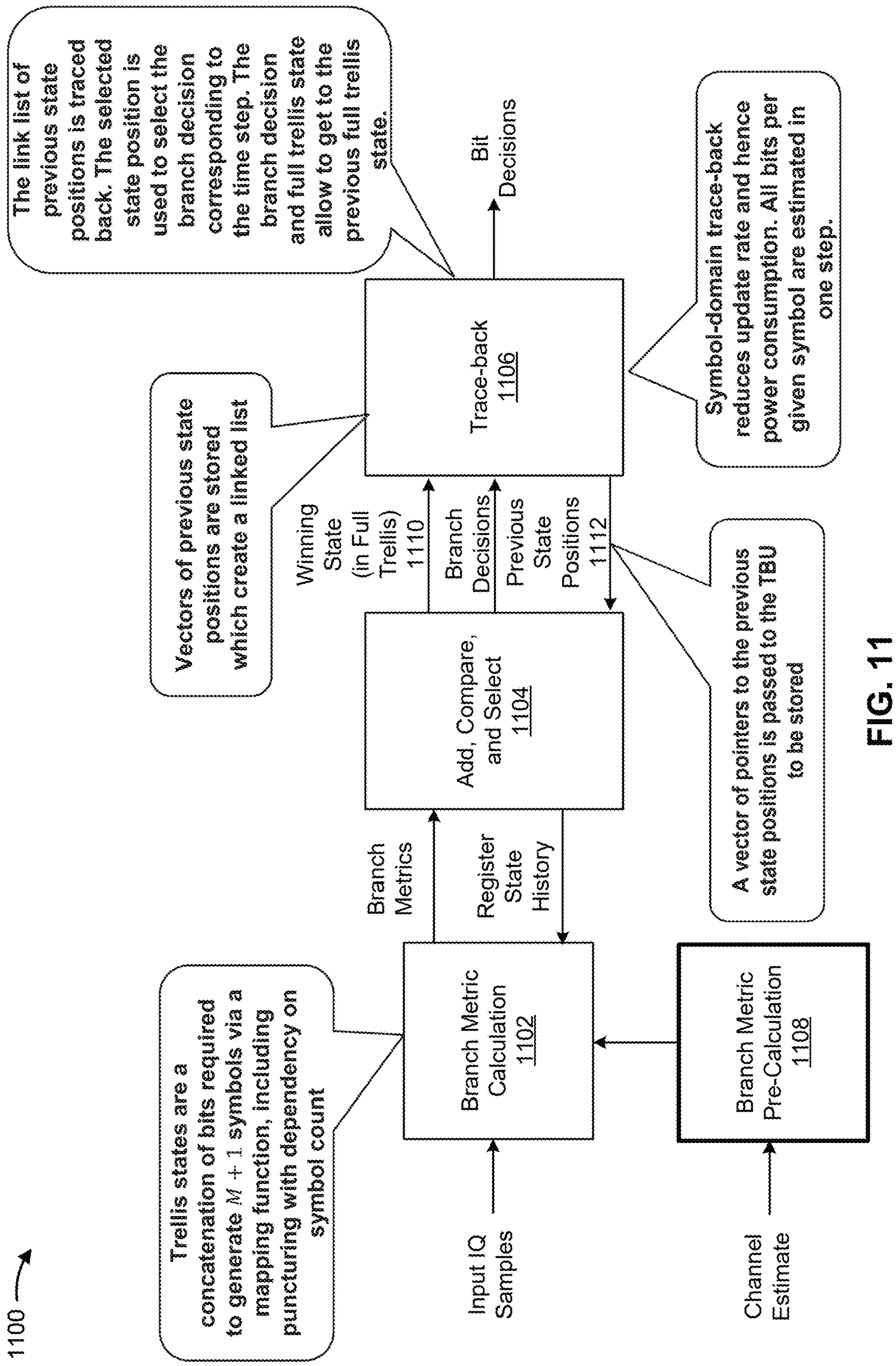
FIG. 11 is a diagram illustrating an example of branch calculations as in FIG. 10 with a summary of features described for the present disclosure.

FIG. 11 is a diagram illustrating an example 1100 of branch calculations as in FIG. 10 with a summary of features described for the present disclosure.

The trellis states may be a concatenation of bits required to generate M+1 symbols via a mapping function inside the branch metric calculation 1102, including puncturing with dependency on a symbol count. M is assumed channel memory in the number of symbols. Equalization, convolutional decoding and puncturing removal may be combined together. Bit puncturing may be embodied into a symbol-domain equalizer and decoder. Puncturing may be performed at a bit level to scale data rates from a base-rate convolution encoder. However, Viterbi equalization may expect symbol domain processing.

The add, compare, and select unit 1104, the branch metrics are added to path metrics for a reduced quantity of states as compared to a full trellis. For example, only $N_s$ state positions and $N_s$ branch decisions are stored every symbol time in the trace-back memory, not branch decisions as per full trellis. This reduces the large memory cost for higher data rates. Currently winning state 1110 (in full trellis) may be forwarded to the trace-back unit 1106.

After the path metrics and branch metrics are added together, for each state, the incoming branches into the state are compared. Branch decisions may be used to determine the winning path across the whole sequence from the current winning state. The index of the winning state may be used to select the overall winning path, and from the winning path, the trace-back unit 1106 may trace back through the full trellis. The trace-back unit 1106 may process data at a symbol rate, and the trace-back may return a variable number of bit estimates for every symbol if puncturing pattern causes the number of bits per symbol to vary. The trace-back unit 1106 may proceed back to a determined trace-back length. Vectors of previous state positions 1112 may be stored in a link list of state positions creating pointers to the associated branch decision memory, which enables recursive reconstruction of previous (full-trellis) states from the winning state index. The selected state positions are used to select the branch decision corresponding to the time step. In some aspects, symbol-domain trace-back reduces update rate and hence power consumption compared to operating the trace-back in the bit domain. All bits per given symbol are estimated in one step. A branch metric pre-calculation unit 1108 may perform pre-calculations of branch metrics with channel estimates.

As indicated above, FIG. 11 is provided as an example. Other examples may differ from what is described with regard to FIG. 11.

Figure 12:
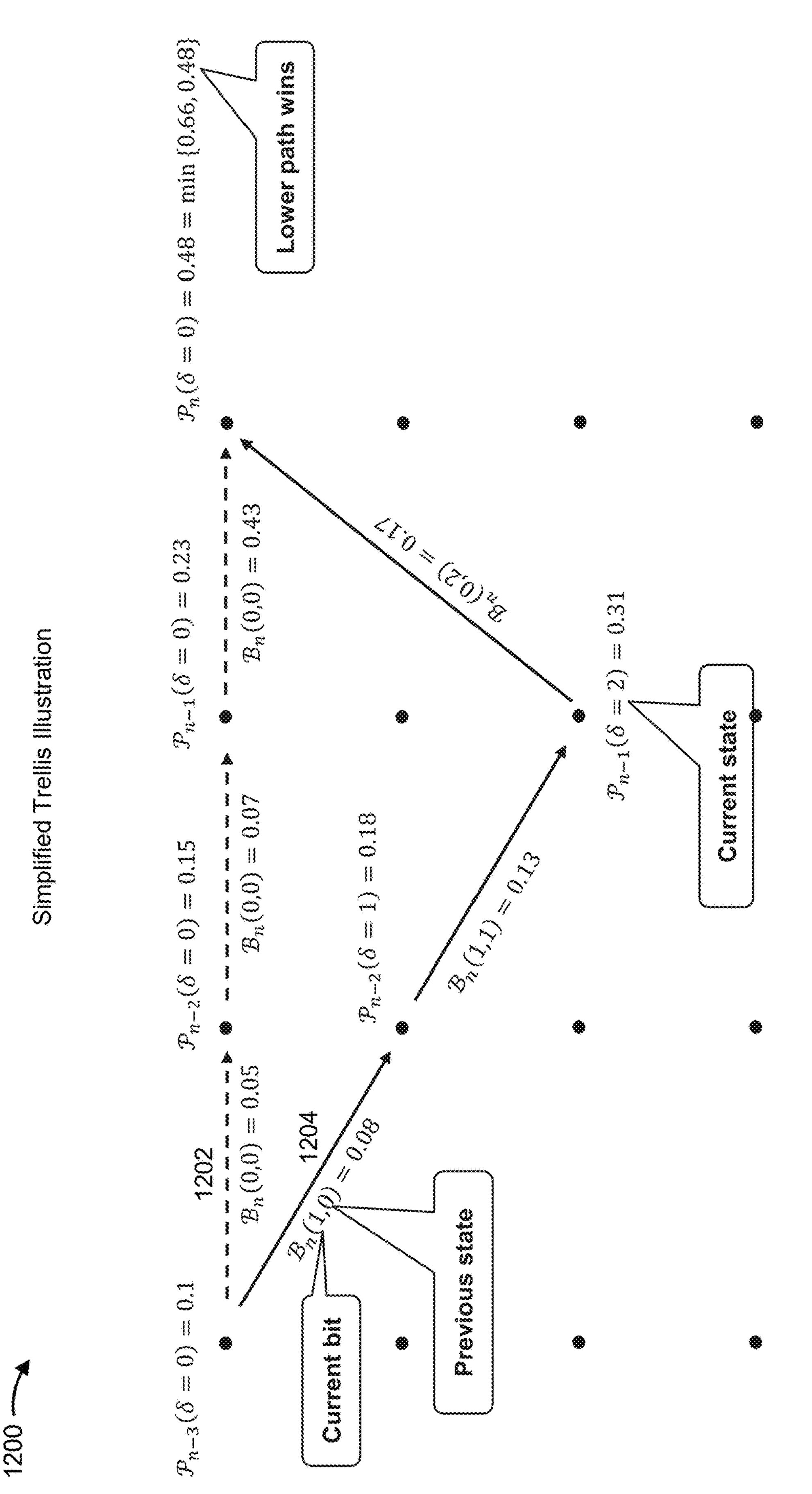
FIG. 12 is a diagram illustrating an example of bit processing for a multi-path channel as an end-to-end system model, in accordance with the present disclosure.

FIG. 12 is a diagram illustrating an example 1200 of a trellis with two competing paths, where one path wins due to a lower accumulated path metric (assuming the path metric is Euclidean distance), in accordance with the present disclosure.

Example 1200 shows a trellis that is part of a joint Viterbi equalizer and decoder used for a maximum likelihood sequence estimation (MLSE). A channel model and channel taps H are known for an estimated value $\hat{H}$. As for the AWGN, the Gaussian noise terms $w^{(p)}[n]$ are expected to be across all values of n and p as $$p_w(w) = \frac{1}{\pi\sigma_w^2}\exp\left(-\frac{|w|^2}{\sigma_w^2}\right)$$

with the system model $r^{(p)}[n]=x^{(p)}[n]+w^{(p)}[n]$. The ML estimate of Tx sequence of $N_b$ bits $b_0, \ldots, b_{N_b-1}$ contained in N Tx symbols may hence be obtained as follows:

$$\begin{aligned}(\hat{b}_0, \ldots, \hat{b}_{N_b-1}) &= \underset{b_0, \ldots, b_{N_b-1}}{\arg\max}\ p(r_0, \ldots, r_{N-1} \mid b_0, \ldots, b_{N_b-1}) \\ &= \underset{b_0, \ldots, b_{N_b-1}}{\arg\max} \prod_{p=0}^{P-1}\prod_{n=0}^{N-1} p_w\left(r^{(p)}[n] - x^{(p)}[n]\right)\end{aligned}$$

The Tx bits may pass through the multi-path channel. The purpose of the MLSE may be to estimate the transmitted bits $\hat{b}_0, \ldots, \hat{b}_{N_b-1}$. These are estimates, and the maximum likelihood criterion indicates what is needed to find these bits, such that the bits maximize the likelihood function.

Simplifying, assuming a channel filter has a bandwidth greater than an oversample rate:

$$\begin{aligned}(\hat{b}_0, \ldots, \hat{b}_{N_b-1}) &= \arg\max \prod_{n=0}^{N-1}\prod_{p=0}^{P-1} p_w\left(r^{(p)}[n] - x^{(p)}[n]\right) \\ &= \underset{b_0, \ldots, b_{N_b-1}}{\arg\max}\ \exp\left(-\frac{1}{\sigma_w^2}\sum_{n=0}^{N-1}\sum_{p=0}^{P-1}\left|r^{(p)}[n] - x^{(p)}[n]\right|^2\right) \\ &= \underset{b_0, \ldots, b_{N_b-1}}{\arg\min} \sum_{n=0}^{N-1}\sum_{p=0}^{P-1}\left|r^{(p)}[n] - x^{(p)}[n]\right|^2 \\ &= \underset{b_0, \ldots, b_{N_b-1}}{\arg\min} \sum_{n=0}^{N-1}\|r_n - x_n\|^2.\end{aligned}$$

This is the exponential function here taken to the maximum. The minimum of the argument may be taken without changing the outcome of the minimums and the maximum search. To find the minimum of the function, it is enough to sum the distances (difference between the received samples and the received samples without the noise). Taking the distance may include taking the difference between the two and squaring the difference, to obtain a squared Euclidean distance. By summing the squared Euclidean distances for each symbol, the total metric may be used to estimate the transmitted symbols.

As part of a Viterbi Algorithm (VA), for any candidate bit sequence $b_m, \ldots, b_{m-N_\delta-N_g+1}$, a branch metric may be defined at a symbol time index n as $$\mathcal{B}_n(b_m, \ldots, b_{m-N_\delta-N_g+1}) \stackrel{def}{=} \|r_n - x_n\|^2 = \left\|r_n - Hf(b_m, \ldots, b_{m-N_\delta-N_g+1})\right\|^2 = \left\|r_n - Hf\left(\underbrace{\{b_{m-i}\}_{i=0}^{N_g-1}}_{b_n}, \delta_n\right)\right\|^2 = \mathcal{B}_n(b_n, \delta_m).$$

A path metric $\mathcal{P}_n$ may be defined at time index n at any state $\delta$ as $$\mathcal{P}_n(\delta) = \min_{\check{b}_{\to\delta}, \check{\delta}_{\to\delta}} \mathcal{P}_{n-1}(\check{b}_{\to\delta}, \check{\delta}_{\to\delta}) + \mathcal{B}_n(\check{b}_{\to\delta}, \check{\delta}_{\to\delta})$$

as the minimum sum of the previous path metric $\mathcal{P}_{n-1}(\check{b}_{\to\delta}, \check{\delta}_{\to\delta})$ and branch metric $\mathcal{B}_n(\check{b}_{\to\delta}, \check{\delta}_{\to\delta})$ across combinations of current branch bits per symbol $\check{b}_{\to\delta}$ and previous states $\check{\delta}_{\to\delta}$ leading to the current state $\delta$.

The Viterbi Algorithm may be applied to the trellis to find the symbol sequence that minimizes the total path metric $\mathcal{P}_N$. Once the symbol sequence is estimated, the bits can be simply extracted from the estimated symbols. N symbols may be used to calculate this expression for each of the symbols, and for the sake of the Viterbi algorithm, the branch metric may be a contribution to this overall sum. The sum squared at time n may be defined as the branch metric at time n, denoted as $\mathcal{B}_n$.

According to the Viterbi algorithm, the path metric at that state $\delta$ is an addition of the previous path metric that leads to that state $\delta$ from the previous time step N−1, and the current branch metric calculated from the previous path leading to this state $\delta$. To determine the bits that had been transmitted and which one is the actual winning state, a wireless device that receives the bits may calculate the branch metrics for all possible combinations expected of the transmitted bits and assume states and the path metric are to be maintained for each of the possible states.

In some aspects, the wireless device may use a vector $s_n$ or a function f( ) with the previous bits to map into the branch metric calculation $\mathcal{B}_n$ (e.g., defined as a Euclidean distance between the vector of the received samples at a symbol time and the vector of reconstructed received samples at a symbol time). And given there is no noise and the used channel estimate taps are an accurate representation of the equivalent channel impulse response, the Euclidean distance between the two may be the branch metric. The branch metric may accumulate from one symbol to the next symbol and over all of the symbols up to a symbol time and that defines the path metric $P_n$ according to the Viterbi algorithm.

Example 1200 starts at $P_{n-3}$ and there is a branch metric at time n−3. The first index may be a state index (row of possible state positions) that is set to 0. The second index may denote the state (0 or 1), which is state 0. The branch metric 1202 may be calculated to be 0.05, and the opposite branch metric 1204 from that state may be calculated to be 0.08. Each path accumulates the branch metrics of the path. For example, if the path proceeds in the direction of branch metric 1202 (adding 0.05), the accumulated metric goes from 0.1 to 0.15, and then the next branch metric is calculated to be 0.07, which is added to 0.15 for a path metric of about 0.23. The branch metric is calculated to be 0.43 to give an accumulated path metric of 0.66. The other competing path is in the direction of branch metric 1204 and arrives at the state and at an overall accumulated path metric of 0.48.

At time step N, to evaluate the surviving state for each state, the wireless device observes the path that gives the minimum Euclidean distance and the minimum path metric, which would be the bottom path in the direction of branch metric 1204 with a lower number, i.e., a path metric of 0.48 in the given example, that would be marked as the surviving path. These are some basic steps in the Viterbi algorithm.

As indicated above, FIG. 12 is provided as an example. Other examples may differ from what is described with regard to FIG. 12.

Figure 13:
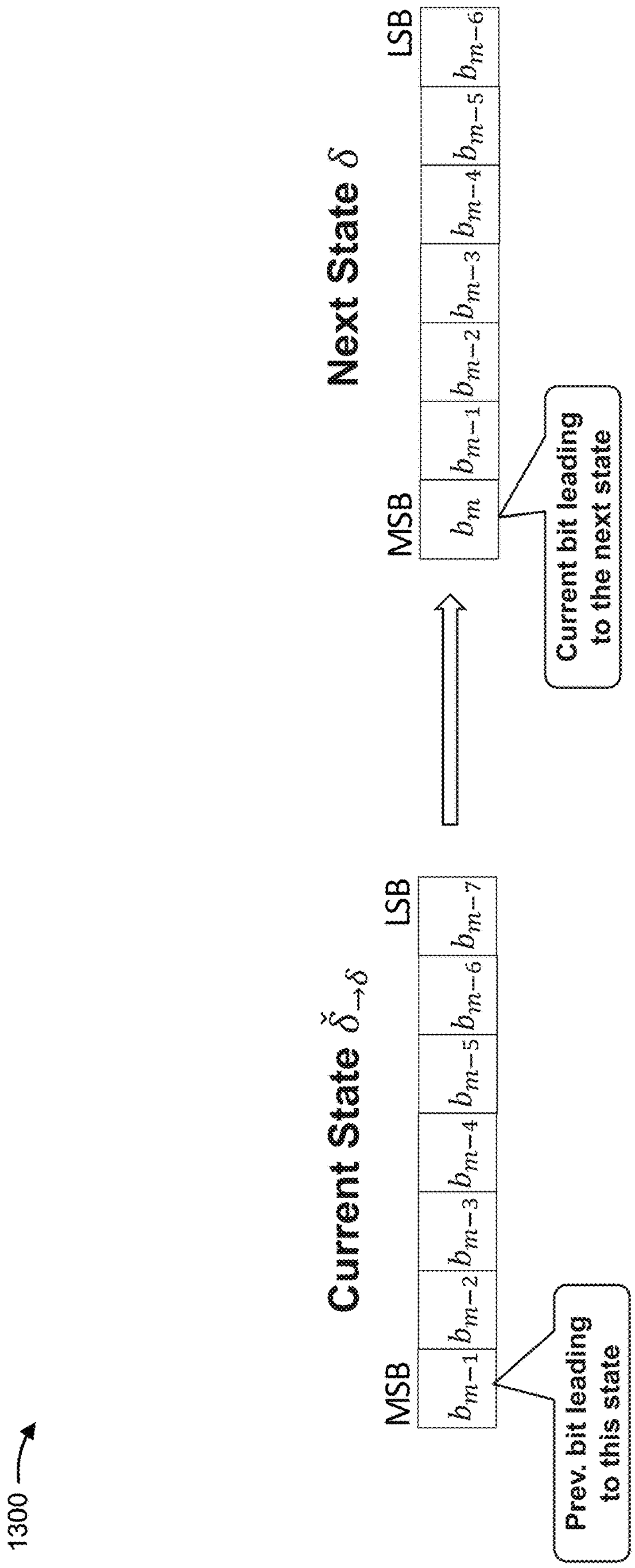
FIG. 13 is a diagram illustrating examples of channel models, in accordance with the present disclosure.

FIG. 13 is a diagram illustrating an example 2100 of current and next states of a Viterbi algorithm with one bit per symbol, in accordance with the present disclosure.

In the trellis, moving from the current state to the next state is achieved by following a simple mathematical operation:

$$\delta = \left\lfloor \frac{\check{\delta}_{\to\delta}}{2^{N_g}} \right\rfloor + \left(\sum_{i=0}^{N_g-1} \check{b}_{\to\delta,i} 2^i\right) 2^{N_\delta - N_g} \stackrel{def}{=} \rho(\check{b}_{\to\delta}, \check{\delta}_{\to\delta}),$$

where $\lfloor . . \rfloor$ denotes division without a reminder and $\breve{b}_{\rightarrow\delta}=[\breve{b}_{\rightarrow\delta,0} \ldots \breve{b}_{\rightarrow\delta,N_g-1}]^T$. The above is a direct consequence of the state definition at bit time m which depends on $N_\delta$ previous bits:

$$\delta_n = \sum\nolimits_{i=0}^{N_\delta-1} b_{m-N_\delta-N_g+1-i}\, 2^i.$$

In scenario of an HDT2, where $N_g=1$ and $N_\delta=7$, the transition is illustrated by example 1300. The current bit can be calculated from the next state as:

$$b_m = \left\lfloor \frac{\delta}{2^{N_\delta-1}} \right\rfloor.$$

If $N_g$ is equal three, the wireless receiver may divide by 8 and this symbol implies that the reminder is neglected after division. Taking the integer part after division is operationally equivalent to shifting the original state index to the right. There is a shift to the right, and after the shift whatever has been shifted out of the original range is discarded. Next, the new branch bits have come in and are assigned to the most significant bit (MSB) positions that have come in.

In example 1300, $N_g$ is equal to 1. Divide by two and discard the lowest least significant bit (LSB). The process shifts the whole sequence of bits to the right. So, $b_{m-7}$ is removed and $b_m$ is the new branch bit.

As indicated above, FIG. 13 is provided as an example. Other examples may differ from what is described with regard to FIG. 13.

Figure 14:
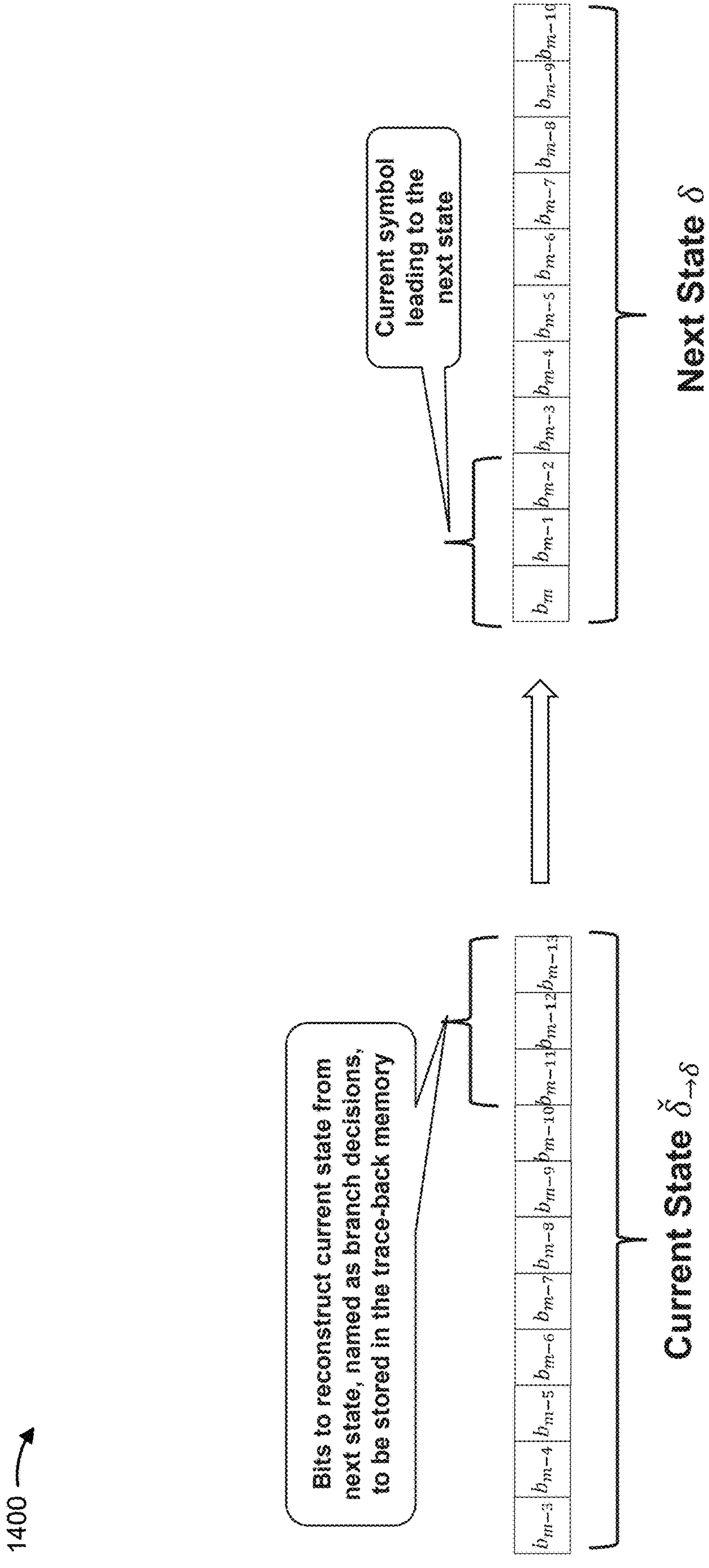
FIG. 14 is a diagram illustrating an example of a system model of mapping transmit bits into a transmitted IQ symbol for an HDT 2 Mbps data rate, in accordance with the present disclosure.

FIG. 14 is a diagram illustrating an example 1400 of states of a Viterbi algorithm, in accordance with the present disclosure.

If the data rate is more than 1 bit per symbol, for example HDT6 where $N_g=3$, the branch bits for the current symbol may be calculated from the next state as:

$$\sum_{i=0}^{2} b_{m-i}\, 2^i = \left\lfloor \frac{\delta}{2^{N_\delta-N_g}} \right\rfloor$$

If there are $N_g=3$ bits per symbol and the process is moving to the next state, the whole structure may be shifted to the right by three, because there three bits per symbol and the new 3 bits come to the MSB positions, as shown in example 1400. Branch bits may be calculated if the process proceeds from the current state to the next state, or from the previous state to the current state. Three LSB bits are removed: $b_{m-11}$, $b_{m-12}$, and $b_{m-13}$.

If the bits are removed and not remembered, then the wireless receiver may not be able to go from next state back to the current state in the trace-back operation with the transmitted bits are to be estimated. These bits are branch decisions and may be stored in memory. However, if the Viterbi algorithm is to be executed in the symbol domain, in some aspect, the wireless receiver may store all of the bits per symbol that are needed for the current symbol. This would be the three bits. Given the number of bits of the state and 6, which in this case would be 11, $N_g$ may be number of bits per symbol equal to three.

A function may be defined that returns $N_{g,n}$ bits $b_{sym,n}=[b_{n,0} \ldots b_{n,N_{g,n}-1}]^T$ of the nth symbol that caused transition into state δ, and $$b_{n,i} = \Theta(\delta, i, n) \stackrel{def}{=} \mathrm{mod}\left(\frac{\delta}{2^{N_\delta-N_{g,n}-i}}, 2\right).$$

In some aspects, the wireless receiver may obtain any bits from the original state index given the bit index i and symbol time n.

A function may be defined to map the next state index δ and branch decision bits $b_{m-11}$, $b_{m-12}$, $b_{m-13}$ back to the previous state. In general terms, this may be a function:

$$\breve{\delta}_{\rightarrow\delta} = \theta(b_{dec}, \delta) \stackrel{def}{=} 2^{N_g}\,\mathrm{mod}(\delta, 2^{N_\delta-N_g}) + \sum_{i=0}^{N_g-1} b_{dec,i} 2^i \; b_{dec} \stackrel{def}{=} [b_{dec,0}, \ldots, b_{dec,N_g-1}]^T$$

The branch decisions may be obtained from the current state index $\breve{\delta}_{\rightarrow\delta}$ as $bdec=\vartheta(\breve{\delta}_{\rightarrow\delta}) \stackrel{def}{=} \mathrm{mod}(\breve{\delta}_{\rightarrow\delta}, 2^{N_g})$. A defined function may map the next state, index, and branch decisions back to the previous state. The trace-back operation may return the current state. To achieve this, the previous bits (branch decisions) are to be used to obtain the reverse order by shifting the bits in the opposite direction (to the left). This may be bits $b_{m-3}$, $b_{m-4}$, and so on. New bits may be discarded and the branch decisions may be appended to return to the current state, as part of the trace-back. This may include multiplying by $2^{N_g}$, which involves shifting the whole structure to the left.

The wireless receiver may consider all of the path metrics $P_n$ and select the path metric that has the lowest number as the winner to indicate the (global) winning state. The wireless receiver may identify the state index value of the winning state. That is, proceeding backwards from the current state or from the next state back to the current state, and all the way to the original state at the very start, occurs only for the winning state. If the wireless receiver proceeds in the other direction, the states of the state positions and the associated branch metrics may be stored. That is, the wireless receiver may recall the branch decisions for the winning state. The bit shifting only occurs as the wireless receiver proceeds through each current state.

The Viterbi algorithm may be involved with a number of trellis states that corresponds to a complexity. The number of states may be calculated as $2^{N_\delta}$ where $$N_{\delta,n} = \sum\nolimits_{k=1}^{M} N_{g,n-\lambda} + K - 1.$$

Examples of the number of trellis states per mode and per M may be listed. For mode HDT2, the number of trellis states is $2^6=64$ for M=1, $2^7=128$ for M=2, $2^8=256$ for M=3, and $2^9=512$ for M=4. For HDT3, the number of trellis states is $2^6=64$ or $2^7=128$ for M=1, $2^8=256$ for M=2, $2^9=512$ or $2^{10}=1{,}024$ for M=3, and $2^{11}=2{,}048$ for M=4. For HDT4, the number of trellis states is $2^7=128$ for M=1, $2^9=512$ for M=2, $2^{11}=2{,}048$ for M=3, and $2^{13}=8{,}192$ for M=4. For HDT6, the number of trellis states is $2^{11}=256$ for M=1, $2^{11}=2{,}048$ for M=2, $2^{14}=16{,}348$ for M=3, and $2^{17}=131{,}072$ for M=4. For HDT8, the number of trellis states is $2^9=512$ or $2^8=256$ for M=1, $2^{13}=8{,}192$ or $2^{12}=4{,}096$ for M=2, $2^{17}=131{,}072$ or $2^{16}=65{,}536$ for M=3, and $2^{20}=1{,}048{,}576$ for M=4.

As indicated above, FIG. 14 is provided as an example. Other examples may differ from what is described with regard to FIG. 14.

Figure 15:
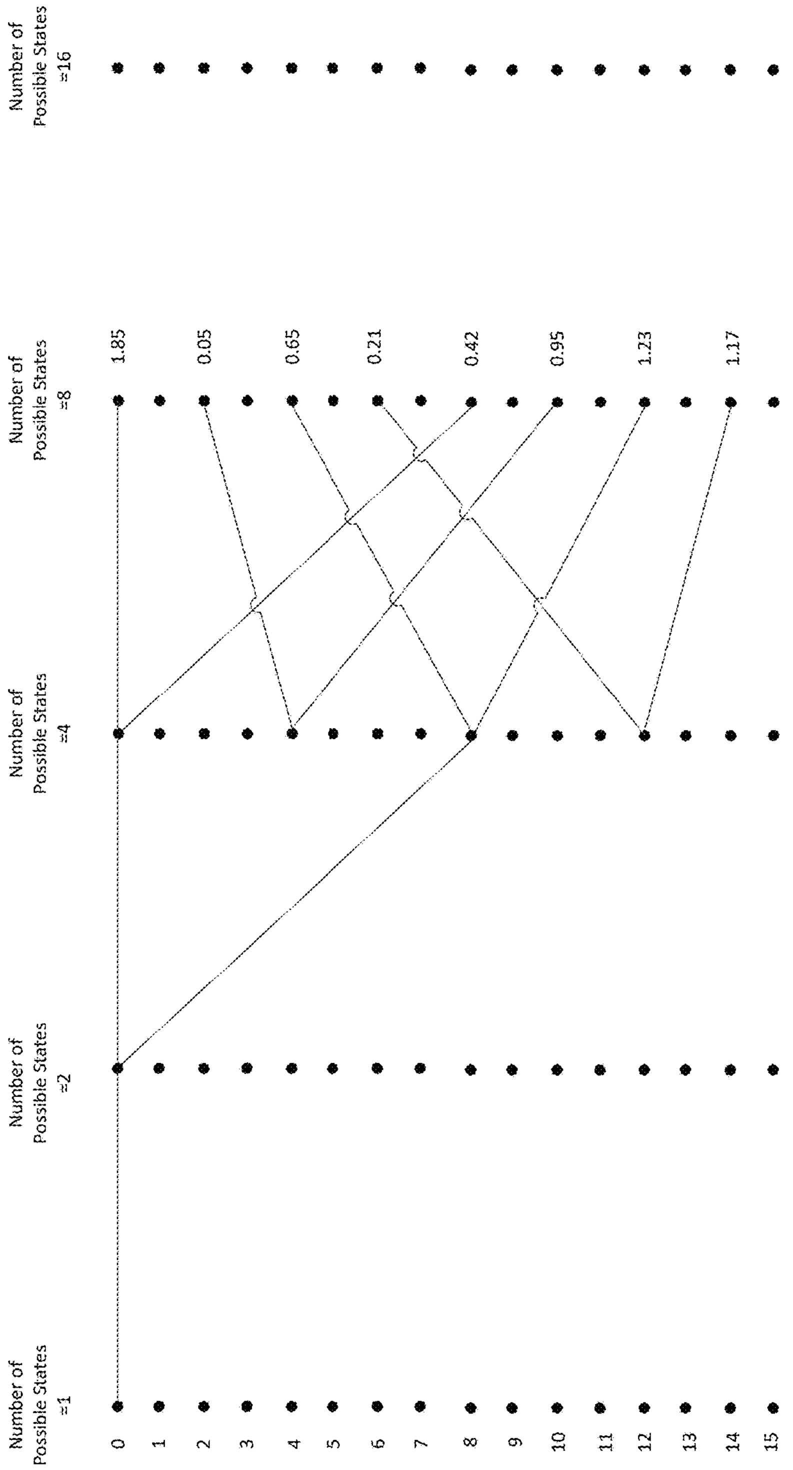
FIG. 15 is a diagram illustrating an example of a system model of mapping transmit bits into two consecutive transmitted IQ symbols for an HDT 2 Mbps data rate with two encoders, in accordance with the present disclosure.

FIG. 15 is a diagram illustrating an example 1500 of a trellis of a Viterbi algorithm, in accordance with the present disclosure.

The number of states may grow by factor $2^{N_g}$ every time a symbol is added to the channel memory of the equalizer. The number of states is excessive. For comparison, the Viterbi decoder itself for K=6 code may require only 32 states. Example 1500 shows a state index with 8 states, which may branch to 16 states at the next state index.

As indicated above, FIG. 15 is provided as an example. Other examples may differ from what is described with regard to FIG. 15.

Figure 16:
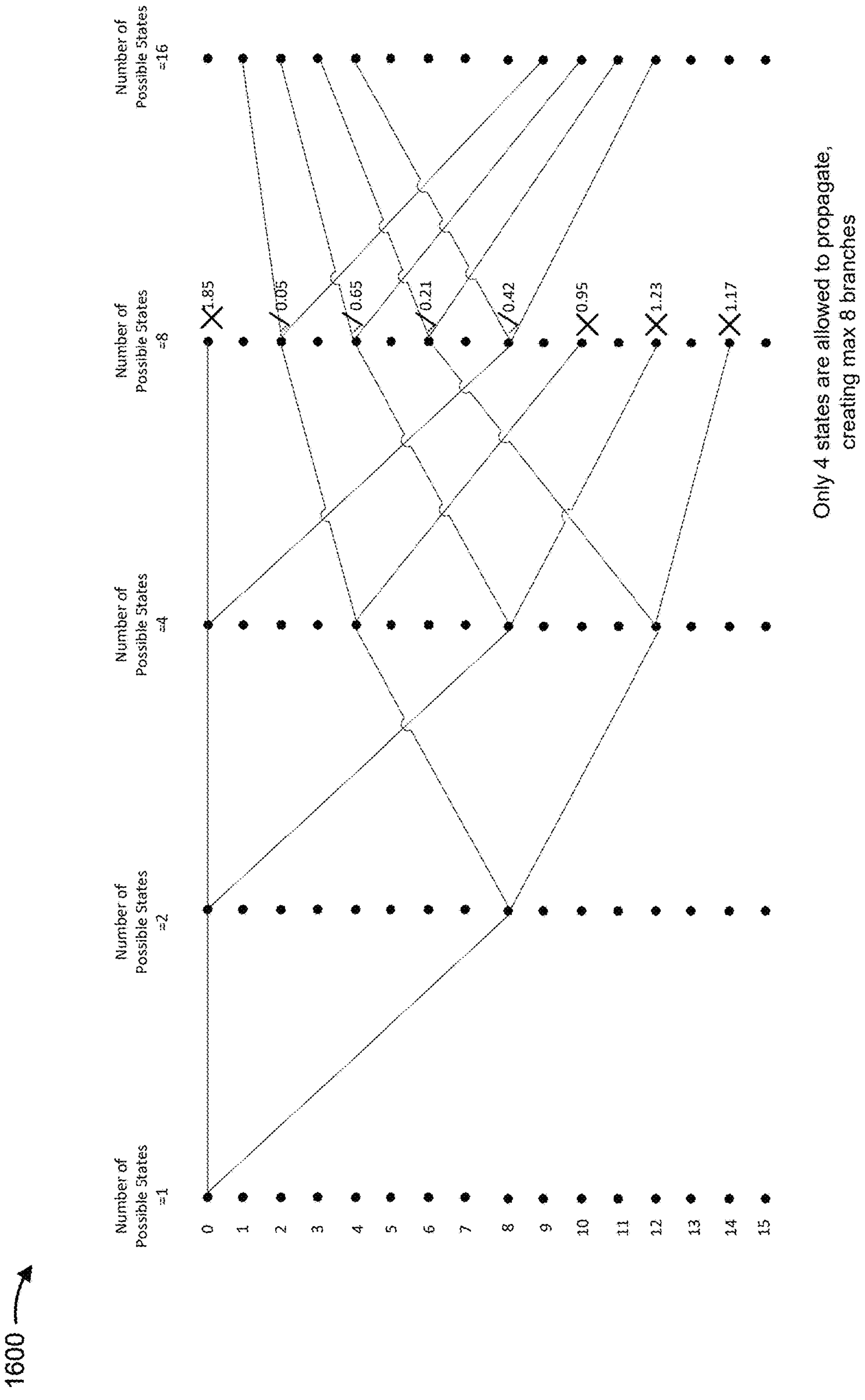
FIG. 16 is a diagram illustrating an example of a system model of mapping transmit bits into three consecutive transmitted IQ symbols for an HDT 2 Mbps data rate with three encoders, in accordance with the present disclosure.

FIG. 16 is a diagram illustrating an example 1600 of a trellis of a Viterbi algorithm, in accordance with the present disclosure.

In some aspects, Reduced-State Sequence Estimation (RSSE) may address this problem, assuming that among a large number of states there is only a subset of valid candidates for the global winner. The number of surviving states may be limited to the states with the best path metric. That is, the wireless receiver may reduce the number of states that are allowed to propagate down to a fixed number of branches (or a fixed number of states) that is maintained throughout stepping of the Viterbi algorithm. There may be a different number of bits per symbol as the Viterbi algorithm proceeds. The surviving states that are selected are expected to have the minimum (or in general the best metric). If the metric is the Euclidean distance, the best metric is the minimum accumulated (squared) Euclidean distance.

Example 1600 shows a 16-State trellis with four surviving states and two branches per state. Only four states are allowed to survive at every time step.

The trellis starts at the very first symbol, and convolutional codes start from state 0. Each column would be a representative of a symbol time. As the process continued from the left to the right, the symbol time is increasing. At the third symbol, there are four states. At the fourth symbol, each branch spreads into two states for a total of 8 possible states. As only four states can survive, the criterion for survival is to select a subset of those states that have the best accumulated path metric. These state are shown by a checkmark. The discarded states are shown by an "X".

In the next symbol, from the $4^{th}$ symbol to the $5^{th}$ symbol, the states would again branch into twice as many states (8 possible states in the 5th symbol). The wireless receiver may again down-select to the four best winning states from 8 possible states.

As indicated above, FIG. 16 is provided as an example. Other examples may differ from what is described with regard to FIG. 16.

Figure 17:
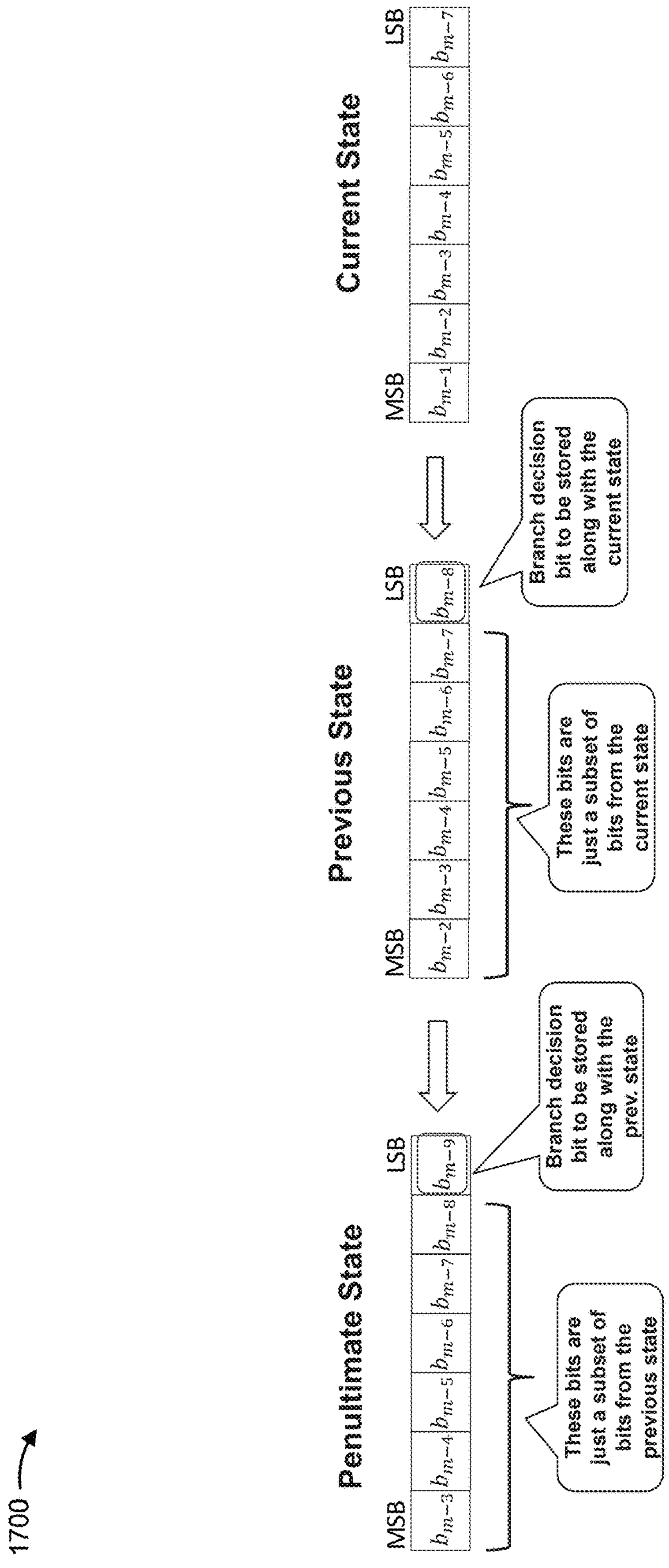
FIG. 17 is a diagram illustrating an example of a system model of mapping transmit bits into three consecutive transmitted IQ symbols for an HDT 3 Mbps data rate that includes puncturing, in accordance with the present disclosure.

FIG. 17 is a diagram illustrating an example 1700 of states of a trace back, in accordance with the present disclosure.

The branch decision and the current state index uniquely determine the previous state and hence allow to trace-back via the trellis. In example 1700, bit $b_{m-8}$ associated with state transition from its previous state needs to be stored, for each current state. To be able to trace-back to the depth of trace-back $N_{tb}$ to determine bit $b_{m-7-(N_{tb}-1)}$ for any of the current state, $(N_{tb}—1)2^{N_\delta}$ branch decisions are to be stored. For example, for $2^{N_\delta}$=16 states and $N_{tb}$=40-bit trace-back for $N_g$=1 (one bit per symbol data rate) may require the storage of 624 bits overall. In the trace-back, if the wireless receiver is at the current state, the wireless receiver may return to the previous state. The wireless receiver may go back from the current state to the previous state, given the fact that the wireless receiver has stored those branch decisions and the branch decisions may be used to return to the previous state. The trace-back length may be, for example, 20 symbols or 40 symbols (right to left) to arrive at a final originating start date. The wireless receiver may determine the bits that were transmitted (bits that are on the left side).

When proceeding from symbol to symbol, the eldest branch decision bits from the eldest symbol time may be discarded, and the new branch decision bits for that given symbol may come into the memory (like first-in first-out).

As indicated above, FIG. 17 is provided as an example. Other examples may differ from what is described with regard to FIG. 17.

FIG. 18 is a diagram illustrating an example 1800 of state reduction, in accordance with the present disclosure.

In RSSE, there are fewer surviving states than the number of actual trellis states, typically $N_s<2^{N_\delta}$. In example 1800, there are $2^{N_\delta}$=16 possible trellis states with only $N_s \overset{\text{def}}{=} 4$ surviving states. The maintained path metrics indices will be $i\in\{0, \ldots, 3\}$ whereas the full-trellis state indices will be $\delta\in\{0, \ldots, 15\}$. Example 1800 shows the 4 surviving states, selected according to the lowest path metrics, along with the state position i, state index δ, and the path metric. For example HDT6, which had 2,048 states, this number may be between zero and 2047 (state index). Typically, the selected number may much lower than 2,048 (e.g., 64, 128, 256, etc.).

As indicated above, FIG. 18 is provided as an example. Other examples may differ from what is described with regard to FIG. 18.

Figure 19:
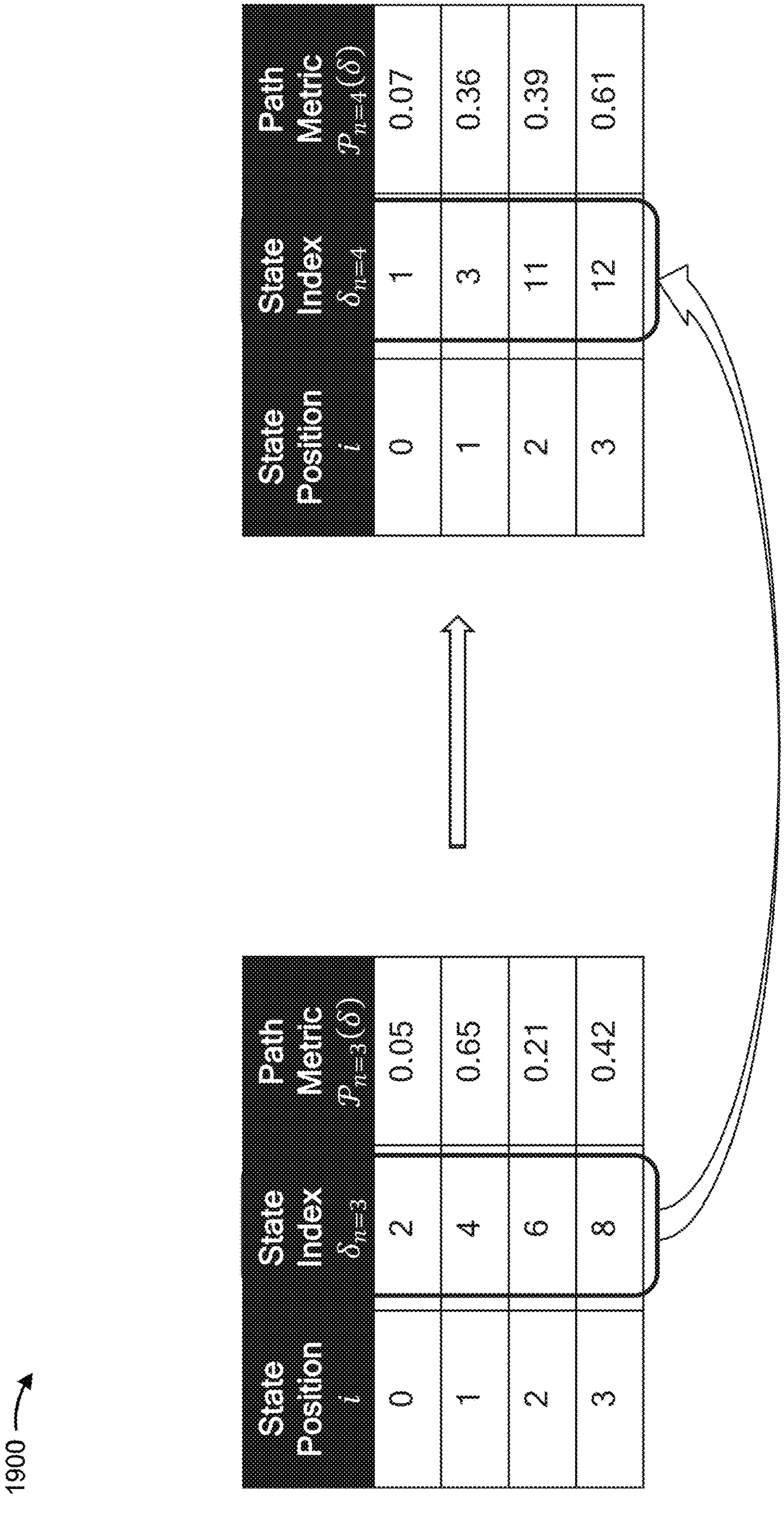
FIG. 19 is a diagram illustrating an example of a generalized system model of mapping a subset of transmit bits into a sequence of M+1 consecutive transmitted IQ symbols, in accordance with the present disclosure.

FIG. 19 is a diagram illustrating an example 1900 of state reduction, with surviving state indices at allocated state positions for the subsequent time step, in accordance with the present disclosure.

Two more steps may be added to the RSSE. Additionally, the state index may change for the maintained 4 states from step-to-step. Example 1900 shows two tables where the set of surviving state indices may change from symbol time 3 to 4. For every branch out, different states may survive. The value of the path may change when changing symbol times. For example, the state index at symbol time n=3 is the surviving states 2, 4, 6, 8, but at symbol time 4, the actual surviving state indices are 1, 3, 11, and 12.

As indicated above, FIG. 19 is provided as an example. Other examples may differ from what is described with regard to FIG. 19.

Figure 20:
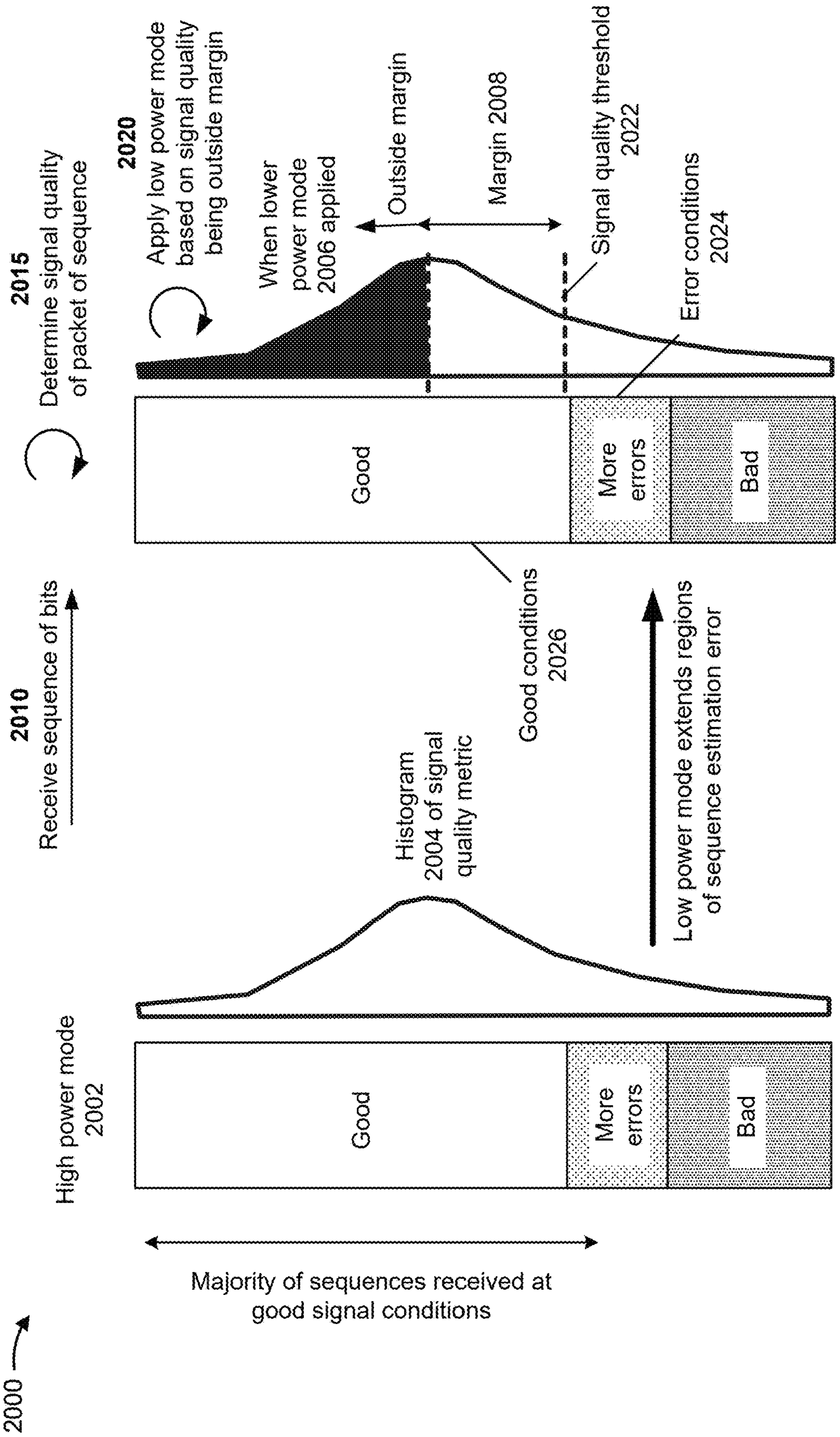
FIG. 20 is a diagram illustrating an example of applying a low power mode, in accordance with the present disclosure.

FIG. 20 is a diagram illustrating an example 2000 of applying a low power mode, in accordance with the present disclosure.

In most scenarios, packets are received under good signal conditions, such that they can sustain a given application. However, due to channel fading, signal conditions vary from packet to packet. To sustain the application, the majority of the packets are to be received at better than minimum required signal conditions, or at a margin. The reduced state trace back operates as a low power mode. When the low power mode is applied to all packets, the nominal sensitivity of the wireless receiver is reduced. That is, the low power mode is not appropriate in all scenarios.

Example 2000 shows a high power mode 2002 where the reduced state trace back is not activated. Most of the sequences of bits are received during good signal conditions. A histogram 2004 shows the signal conditions where packets have historically been received. If the low power mode 2006 is applied during poorer conditions, the sequence estimation errors increase, which reduces throughput.

According to various aspects described herein, a wireless receiver (e.g., central device 105, device 116) may selectively apply the low power mode 2006 to those packets with a sufficient margin 2008 of signal quality, where the estimated signal quality for the given packet is sufficient. For example, the wireless receiver may receive a sequence of bits, as shown by reference number 2010, and determine a signal quality for a packet of the sequence of bits, as shown by reference number 2015.

In some aspects, the wireless receiver may determine the signal quality per sequence of bits estimated based at least in part on a preamble of the packet or a header field in the packet. In some aspects, the wireless receiver may determine the signal quality per fragment of the sequence of bits estimated. In some aspects, the wireless receiver may determine the signal quality every N sequence of bits estimated, where N is a non-negative integer. For example, if N=3, the wireless receiver may determine the signal quality for a third sequence of bits, a sixth sequence of bits, and so forth. Signal conditions may be assessed for the given packet, a group of packets, or a packet part.

As shown by reference number 2020, the wireless receiver may apply the reduced state low power mode based at least in part on the signal quality being outside of a signal quality margin. Example 2000 shows a margin 2008 that extends from a signal quality threshold 2022 between error conditions 2024 and good conditions 2026. The margin 2008 extends into the good conditions 2026 to provide a buffer and more reliability of sequence estimation. As a result, there is no performance loss of the sequence estimation and throughput is not decreased.

In some aspects, applying the reduced state low power mode includes using a reduced set of states as part of a Viterbi algorithm, as described above. The Viterbi algorithm may be part of a joint Viterbi equalizer and decoder. In some aspects, the wireless receiver may apply the reduced state low power mode by determining one or more states for each state position of a trellis as part of time-stepping through the sequence of bits using the Viterbi algorithm, storing previous state positions of the trellis and associated branch decisions, and tracing back through the previous state positions and the associated branch decisions to determine, from a stored global winning state, a transmitted sequence associated with the sequence of bits, such as described above with respect to FIGS. 11-19.

In some aspects, the wireless receiver may store previous state positions of the trellis and associated branch decisions in a link list, where there is a pointer to each previous state position of the trellis. Tracing back through the previous state positions may include tracing back through the link list with the associated branch decisions to determine, from the stored global winning state, the transmitted sequence associated with the sequence of bits.

In some aspects, the wireless receiver may switching to a low power mode by applying a lower trace-back length of the VA ($\stackrel{def}{=} N_{tb}$) and/or a lower number of surviving states in RSSE ($\stackrel{def}{=} N_s$). Both parameters $N_{tb}$ and $N_s$ may impact the complexity and hence power consumption of the algorithm. The number of branch metrics $N_{br}$ to be evaluated may be directly proportional to the number of surviving states $N_{br}=N_s\,2^{N_{bps}}$ where $N_{bps}$ is the number of bits per transmitted symbol.

As indicated above, FIG. 20 is provided as an example. Other examples may differ from what is described with regard to FIG. 20.

Figure 21:
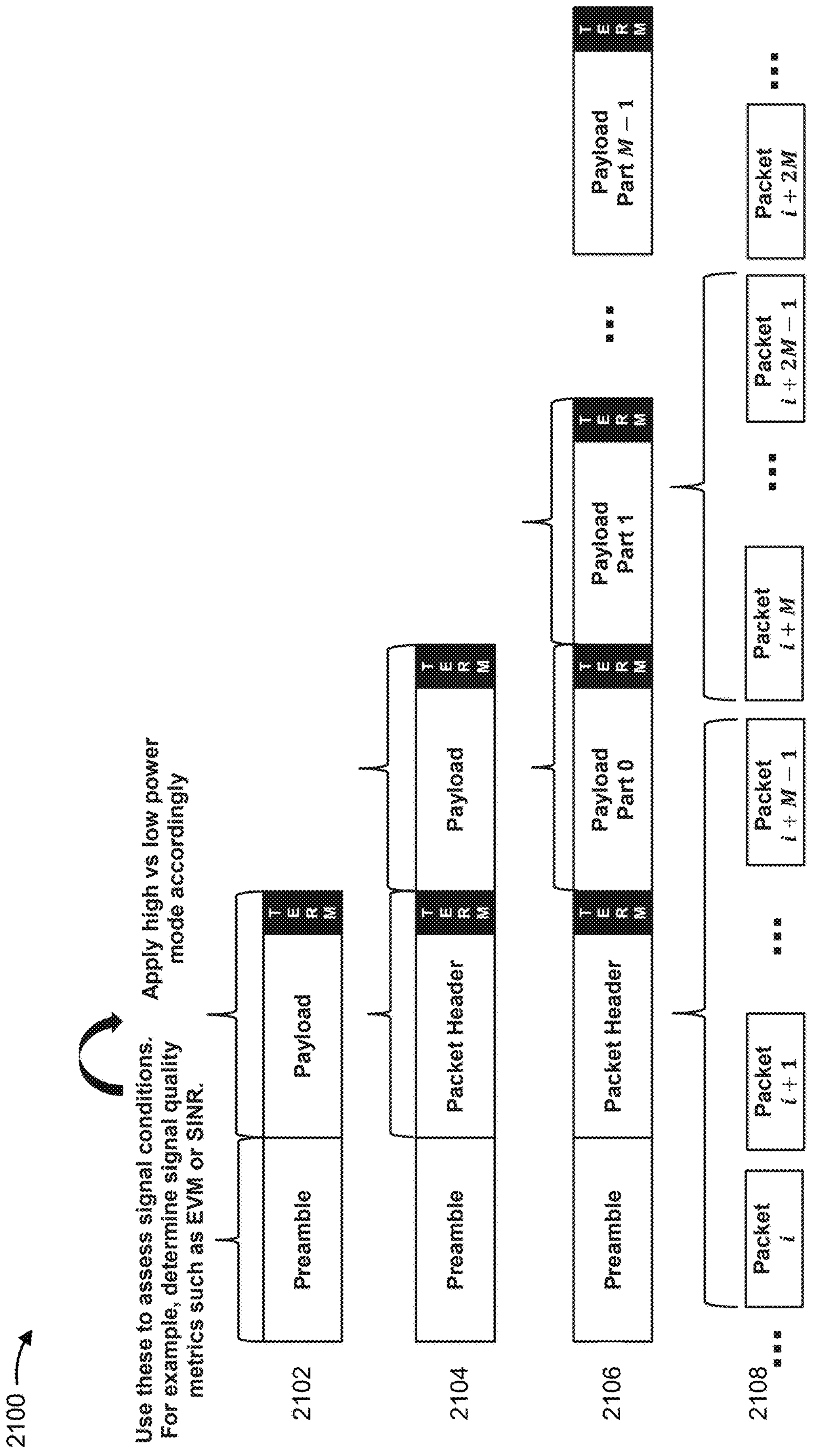
FIG. 21 is a diagram illustrating an example of determining a signal quality, in accordance with the present disclosure.

FIG. 21 is a diagram illustrating an example 2100 of determining a signal quality, in accordance with the present disclosure.

In some aspects, the wireless receiver may determine the signal quality by estimating a signal-to-interference-plus-noise ratio (SINR) at the start of a packet (e.g., for two-antenna chain reception or a single-chain reception). The wireless receiver may use an error vector magnitude (EVM) estimator to determine the signal quality.

Example 2100 shows that the wireless receiver may determine the signal quality from a whole packet or from different parts of a packet or per packet fragment (interval). The wireless receiver may determine the signal quality from a preamble or a payload (e.g., at regular chunks), as shown by example 2102. The wireless receiver may also determine the signal quality from the control header (example 2104). The wireless receiver may determine the signal quality from parts of the payload (example 2106). The wireless receiver may determine the signal quality from a set of packets (example 2108) or from every Nth packet.

As indicated above, FIG. 21 is provided as an example. Other examples may differ from what is described with regard to FIG. 21.

Figure 22:
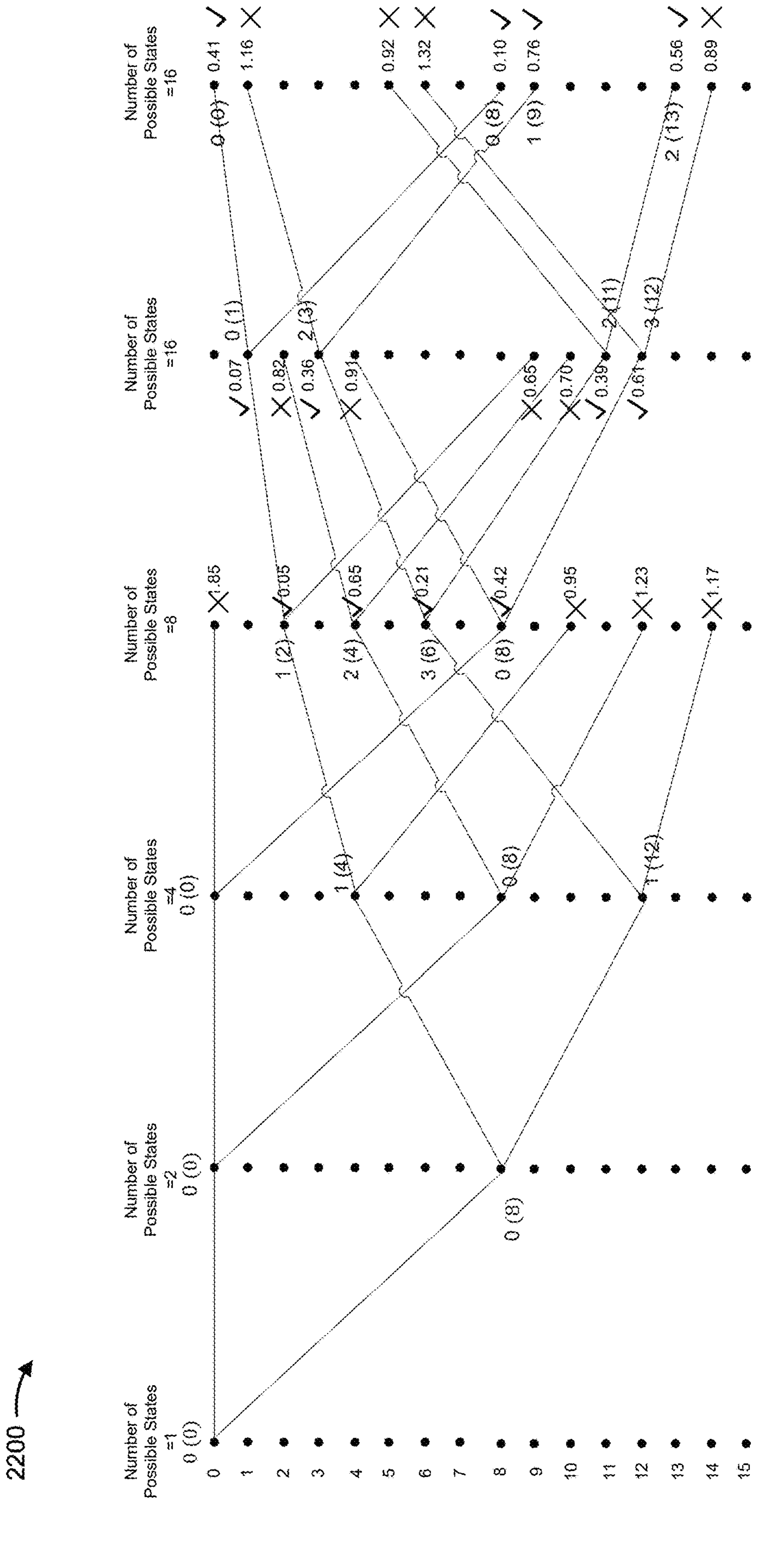
FIG. 22 is a diagram illustrating an example of a trellis of a reduced state sequence estimator (RSSE) using a Viterbi algorithm with multiple time steps, in accordance with the present disclosure.

FIG. 22 is a diagram illustrating an example 2200 of a trellis of an RSSE using a Viterbi algorithm with multiple time steps, in accordance with the present disclosure.

Example 2200 shows example state positions. For example, 1 (4) indicates that the previous state position was 1 and the current state index is 4. This allows trace back for the RSSE algorithm. However, previous state positions of the non-surviving states for RSSE are not stored for trace back.

In some aspects, a wireless receiver (e.g., central device 105, device 115) may store the surviving state indices only in the current time step, and the recent history of previous state positions in a link list. The link list may include pointers to previous state positions. Each state position may point to a previous state position, all through the trellis. Starting at any point and using the previous state position, the state positions will always lead to the starting point, just by using the sequence of the pointers.

For example, the wireless receiver may receive a sequence of bits and determine one or more states for each state position of a trellis as part of time-stepping through the sequence of bits using a joint Viterbi equalizer and decoder. The wireless receiver may store, in a link list, a pointer to each previous state position of the trellis and store a branch decision associated with each previous state position. The wireless receiver may trace back through the link list with associated branch decisions to determine, from a stored global winning state, a transmitted sequence associated with the sequence of bits. By storing previous state positions in a link list, along with branch decisions, the wireless receiver may successfully trace back through the trellis when there are a reduced number of states or a shorter trace back length. As a result, the wireless receiver may reduce its complexity when decoding sequences with larger bit rates.

In some aspects, the wireless receiver may trace back through the link list at a symbol domain, where bits for a given symbol are estimated in one step. In some aspects, the wireless receiver may reduce the possible states for each of one or more state positions to maintain a preferred quantity of surviving states for evaluation for each time step. The bits may be grouped by symbol boundaries with respect to a puncturing pattern, and the quantity of bits per symbol is able to be variable. In some aspects, the wireless receiver may process data at a symbol rate, where the tracing back returns a variable number of bits estimated at each symbol time, and the variable number of bits estimated is given by a quantity of bits per symbol. The quantity of bits per symbol may be based at least in part on an index of a symbol and a modulation and coding scheme (MCS). When the trace back starts giving first estimates of the bits, it will be for the first symbol transmitted and this will determine the number of bits and follow this translated sequence.

In some aspects, the wireless receiver may alternate bit-to-symbol mapping based at least in part on a puncturing pattern to obtain M+1 reference symbols for branch metric evaluation, where M represents the quantity of symbols of channel memory. The wireless receiver may puncture at a bit level to scale data rates from a base-rate convolutional encoder. The puncturing may be based at least in part on a symbol count.

As indicated above, FIG. 22 is provided as an example. Other examples may differ from what is described with regard to FIG. 22.

Figure 23:
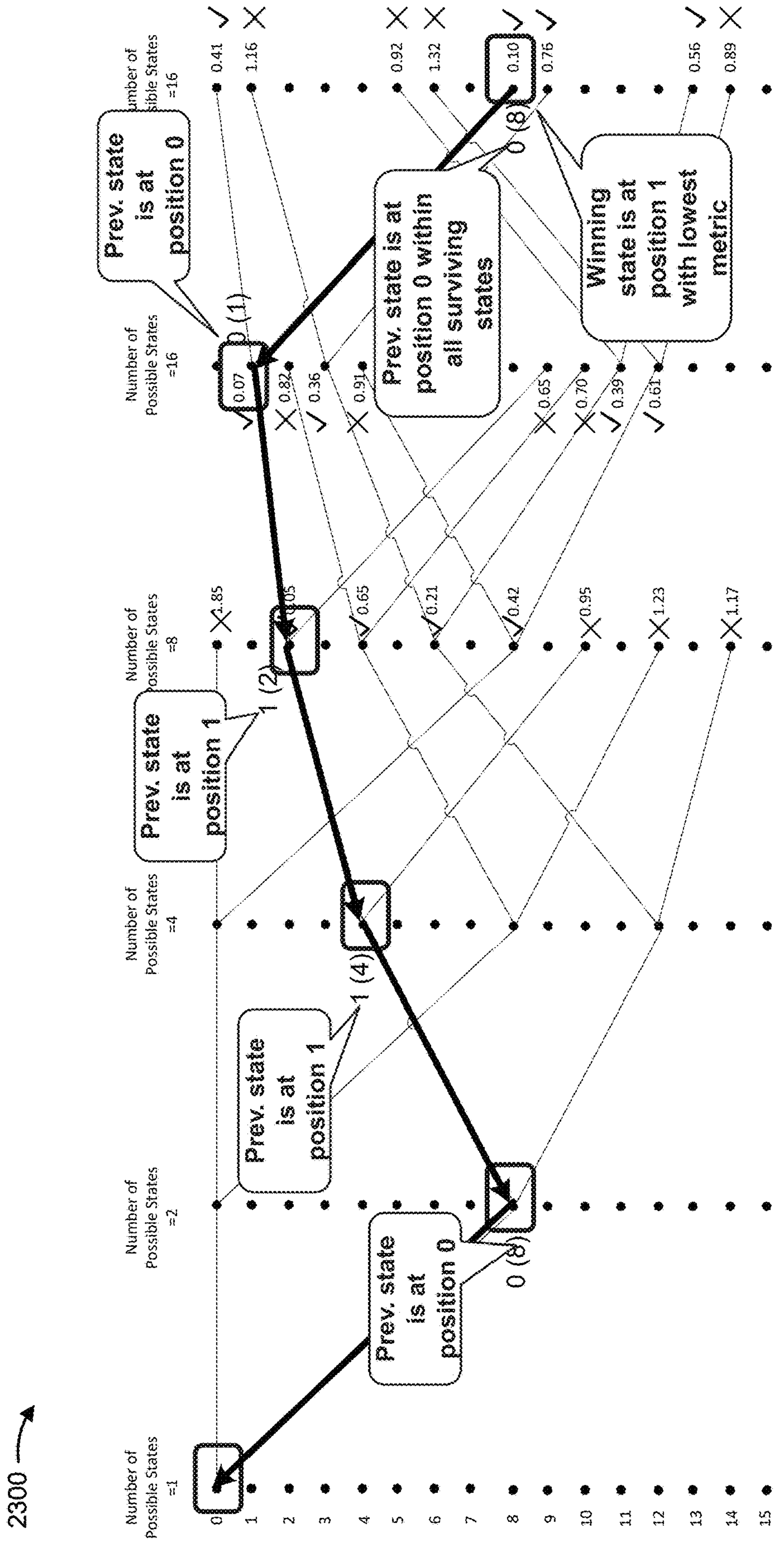
FIG. 23 is a diagram illustrating an example of a trellis of an RSSE Viterbi algorithm with multiple time steps illustrating the linking of the states of the winning path using previous state positions, in accordance with the present disclosure.

FIG. 23 is a diagram illustrating an example 2300 of a trellis of an RSSE Viterbi algorithm with multiple time steps illustrating the linking of the states of the winning path using previous state positions, in accordance with the present disclosure.

Example 2300 shows a winning state in the last step (at symbol time n=5). The path from the end state to the start state is shown by the dark bold arrows. Along the trace, the previous state positions stored at each time step create a link list. From the end state to the start state: 1 (current) →0→0→1→1→0.

As indicated above, FIG. 23 is provided as an example. Other examples may differ from what is described with regard to FIG. 23.

FIG. 24 is a diagram illustrating an example 2400 of a trace back using a link list of previous state positions and branch decisions stemming from the current winning state index showing decoded bits, in accordance with the present disclosure.

Previous state positions are stored for each time step. As soon as the state position of the current winning state is known, the wireless device may trace back via the link list 3002 to the state position of the start state. Branch decisions may be stored for each time step, for each surviving state, at the corresponding state position at that time step. By applying the same trace-back linking in this branch decision table (as determined by the link list of previous state positions), all of the historical branch decisions of the winning path are known. Having known the current winning state and the history of the branch decisions associated with the winning path, the previous state indices of the winning path may be determined by bit shifting and truncating. The $N_{g,n-i}$ LSB bits of the winning path state index at time step n−i are the bit estimates of the transmitted sequence associated with symbol n−i. A time step may be to a next symbol. This is illustrated in FIG. 24 in the bottom table where the decoded bits are the underlined bits 10001.

As indicated above, FIG. 24 is provided as an example. Other examples may differ from what is described with regard to FIG. 24.

FIG. 25 is a diagram illustrating an example process 2500 performed, for example, at a wireless receiver or an apparatus of a wireless receiver, in accordance with the present disclosure. Example process 2500 is an example where the apparatus or the wireless receiver (e.g., central device 105, device 116) performs operations associated with state reduction for sequence estimation based on signal quality.

As shown in FIG. 25, in some aspects, process 2500 may include receiving a sequence of bits (block 2510). For example, the wireless receiver (e.g., using reception component 2602 and/or communication manager 2606, depicted in FIG. 26) may receive a sequence of bits, as described above.

As further shown in FIG. 25, in some aspects, process 2500 may include determining a signal quality for a packet of the sequence of bits (block 2520). For example, the wireless receiver (e.g., using communication manager 2606, depicted in FIG. 26) may determine a signal quality for a packet of the sequence of bits, as described above.

As further shown in FIG. 25, in some aspects, process 2500 may include applying a reduced state low power mode based at least in part on the signal quality being outside of a signal quality margin (block 2530). For example, the wireless receiver (e.g., using communication manager 2606, depicted in FIG. 26) may apply a reduced state low power mode based at least in part on the signal quality being outside of a signal quality margin, as described above.

Process 2500 may include additional aspects, such as any single aspect or any combination of aspects described below and/or in connection with one or more other processes described elsewhere herein.

In a first aspect, applying the reduced state low power mode includes using a reduced set of states as part of a Viterbi algorithm.

In a second aspect, alone or in combination with the first aspect, the Viterbi algorithm is part of a joint Viterbi equalizer and decoder.

In a third aspect, alone or in combination with one or more of the first and second aspects, applying the reduced state low power mode includes determining one or more states for each state position of a trellis as part of time-stepping through the sequence of bits using the Viterbi algorithm, storing previous state positions of the trellis and associated branch decisions, and tracing back through the previous state positions and the associated branch decisions to determine, from a stored global winning state, a transmitted sequence associated with the sequence of bits.

In a fourth aspect, alone or in combination with one or more of the first through third aspects, storing previous state positions of the trellis and associated branch decisions includes storing, in a link list, a pointer to each previous state position of the trellis, and tracing back through the previous state positions includes tracing back through the link list with the associated branch decisions to determine, from the stored global winning state, the transmitted sequence associated with the sequence of bits.

In a fifth aspect, alone or in combination with one or more of the first through fourth aspects, applying the reduced state low power mode includes using a reduced trace-back length of a Viterbi algorithm.

In a sixth aspect, alone or in combination with one or more of the first through fifth aspects, determining the signal quality includes determining the signal quality per sequence of bits estimated based at least in part on a preamble of the packet or a header field in the packet.

In a seventh aspect, alone or in combination with one or more of the first through sixth aspects, determining the signal quality includes determining the signal quality per fragment of the sequence of bits estimated.

In an eighth aspect, alone or in combination with one or more of the first through seventh aspects, determining the signal quality includes determining the signal quality every N sequence of bits estimated, where N is a non-negative integer.

Although FIG. 25 shows example blocks of process 2500, in some aspects, process 2500 may include additional blocks, fewer blocks, different blocks, or differently arranged blocks than those depicted in FIG. 25. Additionally, or alternatively, two or more of the blocks of process 2500 may be performed in parallel.

Figure 26:
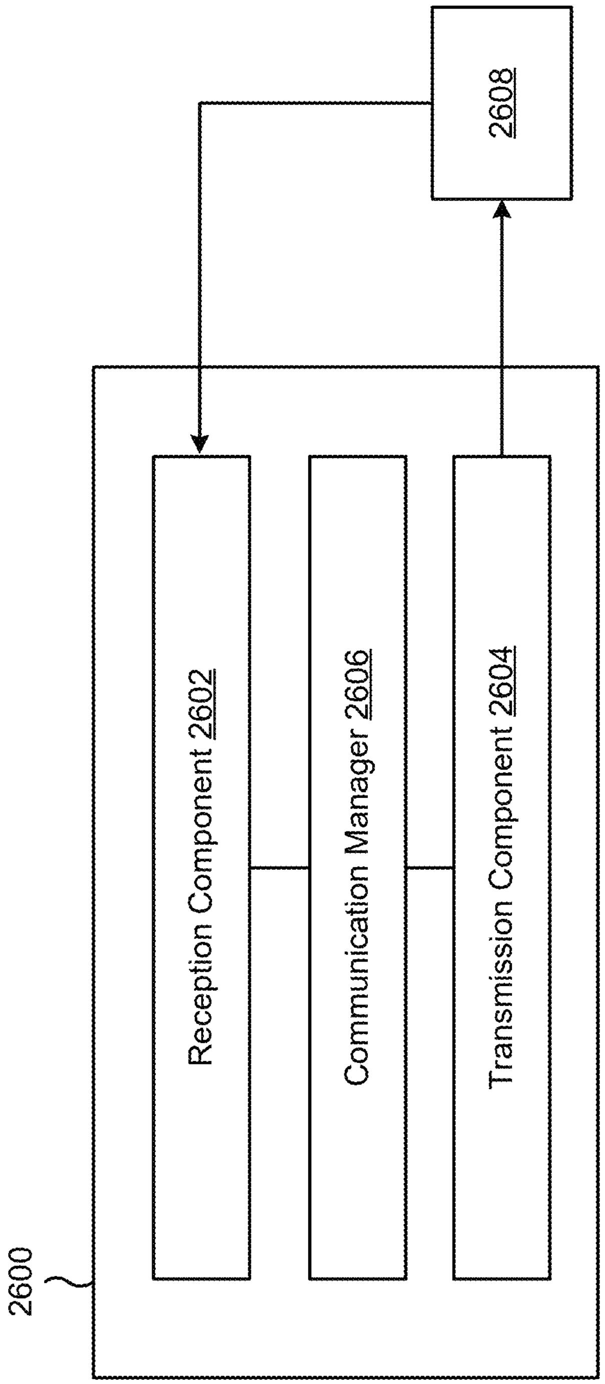
FIG. 26 is a diagram of an example apparatus for wireless communication, in accordance with the present disclosure.

FIG. 26 is a diagram of an example apparatus 2600 for wireless communication, in accordance with the present disclosure. The apparatus 2600 may be a wireless receiver, or a wireless receiver may include the apparatus 2600. In some aspects, the apparatus 2600 includes a reception component 2602, a transmission component 2604, and/or a communication manager 2606, which may be in communication with one another (for example, via one or more buses and/or one or more other components). In some aspects, the communication manager 2606 is the communication manager 140 or 150 described in connection with FIG. 1. As shown, the apparatus 2600 may communicate with another apparatus 2608, such as a central device or an access point, using the reception component 2602 and the transmission component 2604. The communication manager 2606 may be included in, or implemented via, a processing system of the wireless receiver.

In some aspects, the apparatus 2600 may be configured to perform one or more operations described herein in connection with FIGS. 1-24. Additionally, or alternatively, the apparatus 2600 may be configured to perform one or more processes described herein, such as process 2500 of FIG. 25. In some aspects, the apparatus 2600 and/or one or more components shown in FIG. 26 may include one or more components of the wireless receiver described in connection with FIG. 1. Additionally, or alternatively, one or more components shown in FIG. 26 may be implemented within one or more components described in connection with FIG. 1. Additionally, or alternatively, one or more components of the set of components may be implemented at least in part as software stored in one or more memories. For example, a component (or a portion of a component) may be implemented as instructions or code stored in a non-transitory computer-readable medium and executable by one or more controllers or one or more processors to perform the functions or operations of the component.

The reception component 2602 may receive communications, such as reference signals, control information, data communications, or a combination thereof, from the apparatus 2608. The reception component 2602 may provide received communications to one or more other components of the apparatus 2600. In some aspects, the reception component 2602 may perform signal processing on the received communications, and may provide the processed signals to the one or more other components of the apparatus 2600. In some aspects, the reception component 2602 may include one or more components of the wireless receiver described above in connection with FIG. 1, such as a radio, one or more RF chains, one or more transceivers, or one or more modems, each of which may in turn be coupled with one or more antennas of the wireless receiver.

The transmission component 2604 may transmit communications, such as reference signals, control information, data communications, or a combination thereof, to the apparatus 2608. In some aspects, one or more other components of the apparatus 2600 may generate communications and may provide the generated communications to the transmission component 2604 for transmission to the apparatus 2608. In some aspects, the transmission component 2604 may perform signal processing on the generated communications, and may transmit the processed signals to the apparatus 2608. In some aspects, the transmission component 2604 may include one or more components of the wireless receiver described above in connection with FIG. 1, such as a radio, one or more RF chains, one or more transceivers, or one or more modems, each of which may in turn be coupled with one or more antennas of the wireless receiver described in connection with FIG. 1. In some aspects, the transmission component 2604 may be co-located with the reception component 2602.

The communication manager 2606 may support operations of the reception component 2602 and/or the transmission component 2604. For example, the communication manager 2606 may receive information associated with configuring reception of communications by the reception component 2602 and/or transmission of communications by the transmission component 2604. Additionally, or alternatively, the communication manager 2606 may generate and/or provide control information to the reception component 2602 and/or the transmission component 2604 to control reception and/or transmission of communications.

The reception component 2602 may receive a sequence of bits. The communication manager 2606 may determine a signal quality for a packet of the sequence of bits. The communication manager 2606 may apply a reduced state low power mode based at least in part on the signal quality being outside of a signal quality margin.

The number and arrangement of components shown in FIG. 26 are provided as an example. In practice, there may be additional components, fewer components, different components, or differently arranged components than those shown in FIG. 26. Furthermore, two or more components shown in FIG. 26 may be implemented within a single component, or a single component shown in FIG. 26 may be implemented as multiple, distributed components. Additionally, or alternatively, a set of (one or more) components shown in FIG. 26 may perform one or more functions described as being performed by another set of components shown in FIG. 26.

The following provides an overview of some Aspects of the present disclosure:

Aspect 1: A method of wireless communication performed by a wireless receiver, comprising: receiving a sequence of bits; determining a signal quality for a packet of the sequence of bits; and applying a reduced state low power mode based at least in part on the signal quality being outside of a signal quality margin.

Aspect 2: The method of Aspect 1, wherein applying the reduced state low power mode includes using a reduced set of states as part of a Viterbi algorithm.

Aspect 3: The method of Aspect 2, wherein the Viterbi algorithm is part of a joint Viterbi equalizer and decoder.

Aspect 4: The method of Aspect 2, wherein applying the reduced state low power mode includes: determining one or more states for each state position of a trellis as part of time-stepping through the sequence of bits using the Viterbi algorithm; storing previous state positions of the trellis and associated branch decisions; and tracing back through the previous state positions and the associated branch decisions to determine, from a stored global winning state, a transmitted sequence associated with the sequence of bits.

Aspect 5: The method of Aspect 4, wherein storing previous state positions of the trellis and associated branch decisions includes storing, in a link list, a pointer to each previous state position of the trellis, and wherein tracing back through the previous state positions includes tracing back through the link list with the associated branch decisions to determine, from the stored global winning state, the transmitted sequence associated with the sequence of bits.

Aspect 6: The method of any of Aspects 1-5, wherein applying the reduced state low power mode includes using a reduced trace-back length of a Viterbi algorithm.

Aspect 7: The method of any of Aspects 1-6, wherein determining the signal quality includes determining the signal quality per sequence of bits estimated based at least in part on a preamble of the packet or a header field in the packet.

Aspect 8: The method of any of Aspects 1-7, wherein determining the signal quality includes determining the signal quality per fragment of the sequence of bits estimated.

Aspect 9: The method of any of Aspects 1-8, wherein determining the signal quality includes determining the signal quality every N sequence of bits estimated, where N is a non-negative integer.

Aspect 10: An apparatus for wireless communication at a device, the apparatus comprising one or more processors; one or more memories coupled with the one or more processors; and instructions stored in the one or more memories and executable by the one or more processors to cause the apparatus to perform the method of one or more of Aspects 1-9.

Aspect 11: An apparatus for wireless communication at a device, the apparatus comprising one or more memories and one or more processors coupled to the one or more memories, the one or more processors configured to cause the device to perform the method of one or more of Aspects 1-9.

Aspect 12: An apparatus for wireless communication, the apparatus comprising at least one means for performing the method of one or more of Aspects 1-9.

Aspect 13: A non-transitory computer-readable medium storing code for wireless communication, the code comprising instructions executable by one or more processors to perform the method of one or more of Aspects 1-9.

Aspect 14: A non-transitory computer-readable medium storing a set of instructions for wireless communication, the set of instructions comprising one or more instructions that, when executed by one or more processors of a device, cause the device to perform the method of one or more of Aspects 1-9.

Aspect 15: A device for wireless communication, the device comprising a processing system that includes one or more processors and one or more memories coupled with the one or more processors, the processing system configured to cause the device to perform the method of one or more of Aspects 1-9.

Aspect 16: An apparatus for wireless communication at a device, the apparatus comprising one or more memories and one or more processors coupled to the one or more memories, the one or more processors individually or collectively configured to cause the device to perform the method of one or more of Aspects 1-9.

The foregoing disclosure provides illustration and description but is not intended to be exhaustive or to limit the aspects to the precise forms disclosed. Modifications and variations may be made in light of the above disclosure or may be acquired from practice of the aspects. No element, act, or instruction described herein should be construed as critical or essential unless explicitly described as such.

It will be apparent that systems or methods described herein may be implemented in different forms of hardware or a combination of hardware and software. The actual specialized control hardware or software used to implement these systems or methods is not limiting of the aspects. Thus, the operation and behavior of the systems or methods are described herein without reference to specific software code, because those skilled in the art will understand that software and hardware can be designed to implement the systems or methods based, at least in part, on the description herein. A component being configured to perform a function means that the component has a capability to perform the function, and does not require the function to be actually performed by the component, unless noted otherwise.

As used herein, the articles "a" and "an" are intended to refer to one or more items and may be used interchangeably with "one or more" or "at least one." Further, as used herein, the article "the" is intended to include one or more items referenced in connection with the article "the" and may be used interchangeably with "the one or more." Furthermore, as used herein, the terms "set" and "group" are intended to include one or more items and may be used interchangeably with "one or more." Where only one item is intended, the phrase "only one" or "a single one" or similar language is used. Also, as used herein, the terms "has," "have," "having," "comprise," "comprising," "include" and "including," and derivatives thereof or similar terms are intended to be open-ended terms that do not limit an element that they modify (for example, an element "having" A may also have B). Also, as used herein, the term "or" is intended to be inclusive when used in a series and may be used interchangeably with "and/or," unless explicitly stated otherwise (for example, if used in combination with "either" or "only one of"). As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (for example, a+a, a+a+a, a+a+b, a+a+c, a+b+b, a+c+c, b+b, b+b+b, b+b+c, c+c, and c+c+c, or any other ordering of a, b, and c).

As used herein, the term "determine" or "determining" encompasses a wide variety of actions and, therefore, "determining" can include calculating, computing, processing, deriving, estimating, investigating, looking up (such as via looking up in a table, a database, or another data structure), searching, inferring, ascertaining, and/or measuring, among other possibilities. Also, "determining" can include receiving (such as receiving information), accessing (such as accessing data stored in memory) or transmitting (such as transmitting information), among other possibilities. Additionally, "determining" can include resolving, selecting, obtaining, choosing, establishing, and/or other such similar actions.

As used herein, the phrase "based on" is intended to mean "based at least in part on" or "based on or otherwise in association with" unless explicitly stated otherwise. As used herein, "satisfying a threshold" may, depending on the context, refer to a value being greater than the threshold, greater than or equal to the threshold, less than the threshold, less than or equal to the threshold, equal to the threshold, or not equal to the threshold, among other examples.

Even though particular combinations of features are recited in the claims or disclosed in the specification, these combinations are not intended to limit the scope of all aspects described herein. Many of these features may be combined in ways not specifically recited in the claims or disclosed in the specification. The disclosure of various aspects includes each dependent claim in combination with every other claim in the claim set.

What is claimed is:

1. A method of wireless communication performed by a wireless receiver, comprising:

receiving a sequence of bits;

determining a signal quality for a packet of the sequence of bits;

applying a reduced state low power mode based at least in part on the signal quality being outside of a signal quality margin; and wherein applying the reduced state low power mode includes using a reduced set of states as part of a Viterbi algorithm; and wherein applying the reduced state low power mode includes:

determining one or more states for each state position of a trellis as part of time-stepping through the sequence of bits using the Viterbi algorithm;

storing previous state positions of the trellis and associated branch decisions; and tracing back through the previous state positions and the associated branch decisions to determine, from a stored global winning state, a transmitted sequence associated with the sequence of bits.

2. The method of claim 1, wherein the Viterbi algorithm is part of a joint Viterbi equalizer and decoder.

3. The method of claim 1, wherein storing previous state positions of the trellis and associated branch decisions includes storing, in a link list, a pointer to each previous state position of the trellis, and wherein tracing back through the previous state positions includes tracing back through the link list with the associated branch decisions to determine, from the stored global winning state, the transmitted sequence associated with the sequence of bits.

4. The method of claim 1, wherein applying the reduced state low power mode includes using a reduced trace-back length of a Viterbi algorithm.

5. The method of claim 1, wherein determining the signal quality includes determining the signal quality per sequence of bits estimated based at least in part on a preamble of the packet or a header field in the packet.

6. The method of claim 1, wherein determining the signal quality includes determining the signal quality per fragment of the sequence of bits estimated.

7. The method of claim 1, wherein determining the signal quality includes determining the signal quality every N sequence of bits estimated, where Nis a non-negative integer.

8. An apparatus for wireless communication at a wireless receiver, comprising:

one or more memories; and one or more processors coupled to the one or more memories, the one or more processors individually or collectively configured to cause the wireless receiver to:

receive a sequence of bits;

determine a signal quality for a packet of the sequence of bits;

apply a reduced state low power mode based at least in part on the signal quality being outside of a signal quality margin;

wherein to apply the reduced state low power mode, the one or more processors are individually or collectively configured to cause the wireless receiver to use a reduced set of states as part of a Viterbi algorithm; and wherein to apply the reduced state low power mode, the one or more processors are individually or collectively configured to cause the wireless receiver to:

determine one or more states for each state position of a trellis as part of time-stepping through the sequence of bits using the Viterbi algorithm;

store previous state positions of the trellis and associated branch decisions; and trace back through the previous state positions and the associated branch decisions to determine, from a stored global winning state, a transmitted sequence associated with the sequence of bits.

9. The apparatus of claim 8, wherein the Viterbi algorithm is part of a joint Viterbi equalizer and decoder.

10. The apparatus of claim 8, wherein to store previous state positions of the trellis and associated branch decisions, the one or more processors are individually or collectively configure to cause the wireless receiver to store, in a link list, a pointer to each previous state position of the trellis, and wherein to trace back through the previous state positions, the one or more processors are individually or collectively configured to cause the wireless receiver to trace back through the link list with the associated branch decisions to determine, from the stored global winning state, the transmitted sequence associated with the sequence of bits.

11. The apparatus of claim 8, wherein to apply the reduced state low power mode, the one or more processors are individually or collectively configured to cause the wireless receiver to use a reduced trace-back length of a Viterbi algorithm.

12. The apparatus of claim 8, wherein to determine the signal quality, the one or more processors are individually or collectively configured to cause the wireless receiver to determine the signal quality per sequence of bits estimated based at least in part on a preamble of the packet or a header field in the packet.

13. The apparatus of claim 8, wherein to determine the signal quality, the one or more processors are individually or collectively configured to cause the wireless receiver to determine the signal quality per fragment of the sequence of bits estimated.

14. The apparatus of claim 8, wherein to determine the signal quality, the one or more processors are individually or collectively configured to determine the signal quality every N sequence of bits estimated, where Nis a non-negative integer.

15. An apparatus for wireless communication, comprising:

means for receiving a sequence of bits;

means for determining a signal quality for a packet of the sequence of bits; and means for applying a reduced state low power mode based at least in part on the signal quality being outside of a signal quality margin;

wherein applying the reduced state low power mode includes using a reduced set of states as part of a Viterbi algorithm; and wherein applying the reduced state low power mode includes:

determining one or more states for each state position of a trellis as part of time-stepping through the sequence of bits using the Viterbi algorithm;

storing previous state positions of the trellis and associated branch decisions; and tracing back through the previous state positions and the associated branch decisions to determine, from a stored global winning state, a transmitted sequence associated with the sequence of bits.

* * * * *